United States Patent
Hausmann et al.

(10) Patent No.: US 9,070,555 B2
(45) Date of Patent: Jun. 30, 2015

(54) METHOD FOR DEPOSITING A CHLORINE-FREE CONFORMAL SIN FILM

(71) Applicant: Novellus Systems, Inc., Fremont, CA (US)

(72) Inventors: Dennis Hausmann, Lake Oswego, OR (US); Jon Henri, West Linn, OR (US); Bart van Schravendijk, Sunnyvale, CA (US); Easwar Srinivasan, Beaverton, OR (US)

(73) Assignee: Novellus Systems, Inc., Fremont, CA (US)

( * ) Notice: Subject to any disclaimer, the term of this patent is extended or adjusted under 35 U.S.C. 154(b) by 0 days.

(21) Appl. No.: 14/065,334

(22) Filed: Oct. 28, 2013

(65) Prior Publication Data

US 2014/0141626 A1 May 22, 2014

Related U.S. Application Data

(63) Continuation of application No. 13/414,619, filed on Mar. 7, 2012, now Pat. No. 8,592,328.

(60) Provisional application No. 61/588,964, filed on Jan. 20, 2012.

(51) Int. Cl.
 *H01L 21/318* (2006.01)
 *H01L 21/02* (2006.01)
 (Continued)

(52) U.S. Cl.
 CPC ...... *H01L 21/02274* (2013.01); *H01L 21/0217* (2013.01); *H01L 21/02219* (2013.01);
 (Continued)

(58) Field of Classification Search
 CPC ........... H01I 21/0217; H01L 21/02219; H01L 21/0228; H01L 21/02274; C23C 16/345; C23C 16/505
 USPC ...................................... 438/792; 118/723 R
 See application file for complete search history.

(56) References Cited

U.S. PATENT DOCUMENTS 4,500,563 A * 2/1985 Ellenberger et al. .......... 438/710
5,496,608 A * 3/1996 Matsuda et al. ............. 428/64.1
(Continued)

FOREIGN PATENT DOCUMENTS

| EP | 2 278 046 | 1/2011 |
|---|---|---|
| JP | 4364320 | 8/2009 |

(Continued)

OTHER PUBLICATIONS

U.S. Appl. No. 13/963,212, filed Aug. 9, 2013, entitled "Plasma-Activated Deposition of Conformal Films".
(Continued)

*Primary Examiner* — Mary Wilczewski
(74) *Attorney, Agent, or Firm* — Weaver Austin Villeneuve & Sampson LLP

(57) ABSTRACT

Described are methods of making silicon nitride (SiN) materials on substrates. Improved SiN films made by the methods are also included. One aspect relates to depositing chlorine (Cl)-free conformal SiN films. In some embodiments, the SiN films are Cl-free and carbon (C)-free. Another aspect relates to methods of tuning the stress and/or wet etch rate of conformal SiN films. Another aspect relates to low-temperature methods of depositing high quality conformal SiN films. In some embodiments, the methods involve using trisilylamine (TSA) as a silicon-containing precursor.

19 Claims, 8 Drawing Sheets

(51) Int. Cl.
*C23C 16/34* (2006.01)
*C23C 16/505* (2006.01)
*H01L 29/78* (2006.01)

(52) U.S. Cl.
CPC .......... *H01L21/0228* (2013.01); *C23C 16/345* (2013.01); *C23C 16/505* (2013.01); *H01L 29/7843* (2013.01)

(56) References Cited

U.S. PATENT DOCUMENTS

| | | | |
|---|---|---|---|
| 5,670,432 A | 9/1997 | Tsai | |
| 5,856,003 A | 1/1999 | Chiu | |
| 5,874,368 A | 2/1999 | Laxman et al. | |
| 5,932,286 A | 8/1999 | Beinglass et al. | |
| 6,270,572 B1 | 8/2001 | Kim et al. | |
| 6,391,803 B1 | 5/2002 | Kim et al. | |
| 6,428,859 B1 | 8/2002 | Chiang et al. | |
| 6,468,924 B2 | 10/2002 | Lee et al. | |
| 6,528,430 B2 | 3/2003 | Kwan et al. | |
| 6,551,893 B1 | 4/2003 | Zheng et al. | |
| 6,576,053 B1 | 6/2003 | Kim et al. | |
| 6,632,478 B2 | 10/2003 | Gaillard et al. | |
| 6,645,574 B1 | 11/2003 | Lee et al. | |
| 6,723,595 B2 | 4/2004 | Park | |
| 6,730,614 B1 | 5/2004 | Lim et al. | |
| 6,743,738 B2 | 6/2004 | Todd | |
| 6,809,421 B1 | 10/2004 | Hayasaka et al. | |
| 6,828,218 B2 | 12/2004 | Kim et al. | |
| 6,835,417 B2 | 12/2004 | Saenger et al. | |
| 6,861,356 B2 | 3/2005 | Matsuse et al. | |
| 6,930,060 B2 | 8/2005 | Chou et al. | |
| 6,943,092 B2 | 9/2005 | Kim et al. | |
| 6,962,876 B2 | 11/2005 | Ahn et al. | |
| 6,987,240 B2 | 1/2006 | Jennings et al. | |
| 7,001,844 B2 | 2/2006 | Chakravarti et al. | |
| 7,041,335 B2 | 5/2006 | Chung | |
| 7,077,904 B2 | 7/2006 | Cho et al. | |
| 7,081,271 B2 | 7/2006 | Chung et al. | |
| 7,109,129 B1 | 9/2006 | Papasouliotis | |
| 7,115,528 B2 | 10/2006 | Vaartstra et al. | |
| 7,122,222 B2 | 10/2006 | Xiao et al. | |
| 7,122,464 B2 | 10/2006 | Vaartstra | |
| 7,132,353 B1 | 11/2006 | Xia et al. | |
| 7,148,155 B1 | 12/2006 | Tarafdar et al. | |
| 7,151,039 B2 | 12/2006 | Lee et al. | |
| 7,172,792 B2 | 2/2007 | Wang et al. | |
| 7,176,084 B2 | 2/2007 | Lee et al. | |
| 7,205,187 B2 | 4/2007 | Leith et al. | |
| 7,223,649 B2 | 5/2007 | Oh et al. | |
| 7,241,686 B2 | 7/2007 | Marcadal et al. | |
| 7,244,668 B2 | 7/2007 | Kim | |
| 7,250,083 B2 | 7/2007 | Sneh | |
| 7,259,050 B2 | 8/2007 | Chen et al. | |
| 7,261,919 B2 | 8/2007 | Mehregany et al. | |
| 7,294,582 B2 | 11/2007 | Haverkort et al. | |
| 7,297,641 B2 | 11/2007 | Todd et al. | |
| 7,300,885 B2 | 11/2007 | Hasebe et al. | |
| 7,314,835 B2 | 1/2008 | Ishizaka et al. | |
| 7,341,959 B2 | 3/2008 | Brcka | |
| 7,351,668 B2 | 4/2008 | Chou et al. | |
| 7,361,538 B2 | 4/2008 | Luan et al. | |
| 7,390,743 B2 | 6/2008 | Shin | |
| 7,393,561 B2 | 7/2008 | Paranjpe | |
| 7,419,888 B2 | 9/2008 | Yang et al. | |
| 7,435,454 B2 | 10/2008 | Brcka | |
| 7,435,684 B1 | 10/2008 | Lang et al. | |
| 7,462,571 B2 | 12/2008 | Hasebe et al. | |
| 7,482,247 B1 | 1/2009 | Papasouliotis et al. | |
| 7,488,694 B2 | 2/2009 | Kim et al. | |
| 7,507,676 B2 | 3/2009 | Chou et al. | |
| 7,510,984 B2 | 3/2009 | Saito et al. | |
| 7,521,331 B2 | 4/2009 | Park et al. | |
| 7,524,762 B2 | 4/2009 | Marcadal et al. | |
| 7,544,615 B2 | 6/2009 | Vaartstra | |
| 7,572,052 B2 | 8/2009 | Ravi et al. | |
| 7,592,231 B2 | 9/2009 | Cheng et al. | |
| 7,601,648 B2 | 10/2009 | Chua et al. | |
| 7,615,438 B2 | 11/2009 | Ahn et al. | |
| 7,615,449 B2 | 11/2009 | Chung et al. | |
| 7,622,369 B1 | 11/2009 | Lee et al. | |
| 7,622,383 B2 | 11/2009 | Kim et al. | |
| 7,629,267 B2 | 12/2009 | Wan et al. | |
| 7,632,757 B2 | 12/2009 | Matsuura | |
| 7,633,125 B2 | 12/2009 | Lu et al. | |
| 7,638,170 B2 | 12/2009 | Li | |
| 7,645,484 B2 | 1/2010 | Ishizaka | |
| 7,651,729 B2 | 1/2010 | Kim et al. | |
| 7,651,730 B2 | 1/2010 | Hasebe | |
| 7,651,953 B2 | 1/2010 | Todd et al. | |
| 7,651,959 B2 | 1/2010 | Fukazawa et al. | |
| 7,682,657 B2 | 3/2010 | Sherman | |
| 7,713,592 B2 | 5/2010 | Nguyen et al. | |
| 7,758,920 B2 | 7/2010 | Hasebe et al. | |
| 7,776,733 B2 | 8/2010 | Hasegawa | |
| 7,825,039 B2 | 11/2010 | Takahashi et al. | |
| 7,919,416 B2 | 4/2011 | Lee et al. | |
| 7,923,068 B2 | 4/2011 | Dickey et al. | |
| 7,923,378 B2 | 4/2011 | Hasebe et al. | |
| 7,959,985 B2 | 6/2011 | Ishizaka et al. | |
| 7,964,241 B2 | 6/2011 | Hasebe et al. | |
| 7,964,513 B2 | 6/2011 | Todd et al. | |
| 7,981,473 B2 | 7/2011 | Kim et al. | |
| 7,989,365 B2 | 8/2011 | Park et al. | |
| 8,034,673 B2 | 10/2011 | Kadonaga et al. | |
| 8,080,290 B2 | 12/2011 | Hasebe et al. | |
| 8,101,531 B1 | 1/2012 | Li et al. | |
| 8,119,544 B2 | 2/2012 | Hasebe et al. | |
| 8,133,797 B2 | 3/2012 | Van Schravendijk et al. | |
| 8,178,448 B2 | 5/2012 | Nodera et al. | |
| 8,227,032 B2 | 7/2012 | Dussarrat et al. | |
| 8,257,789 B2 | 9/2012 | Matsunaga et al. | |
| 8,278,224 B1 | 10/2012 | Mui et al. | |
| 8,366,953 B2 | 2/2013 | Kohno et al. | |
| 8,383,525 B2 * | 2/2013 | Raisanen et al. | 438/778 |
| 8,394,466 B2 | 3/2013 | Hong et al. | |
| 8,524,612 B2 | 9/2013 | Li et al. | |
| 8,592,328 B2 | 11/2013 | Hausmann et al. | |
| 8,637,411 B2 | 1/2014 | Swaminathan et al. | |
| 8,647,993 B2 | 2/2014 | Lavoie et al. | |
| 8,728,956 B2 | 5/2014 | Lavoie et al. | |
| 2002/0076507 A1 | 6/2002 | Chiang et al. | |
| 2004/0033698 A1 | 2/2004 | Lee et al. | |
| 2004/0053515 A1 | 3/2004 | Comita et al. | |
| 2004/0231799 A1 | 11/2004 | Lee et al. | |
| 2005/0042865 A1 | 2/2005 | Cabral et al. | |
| 2005/0109276 A1 | 5/2005 | Iyer et al. | |
| 2005/0118837 A1 | 6/2005 | Todd et al. | |
| 2005/0159017 A1 | 7/2005 | Kim et al. | |
| 2005/0181535 A1 | 8/2005 | Yun et al. | |
| 2005/0196977 A1 | 9/2005 | Saito et al. | |
| 2005/0233553 A1 | 10/2005 | Kountz et al. | |
| 2005/0260347 A1 | 11/2005 | Narwankar et al. | |
| 2005/0287775 A1 | 12/2005 | Hasebe et al. | |
| 2006/0030148 A1 | 2/2006 | Seutter et al. | |
| 2006/0084283 A1 | 4/2006 | Paranjpe et al. | |
| 2006/0088985 A1 | 4/2006 | Haverkort et al. | |
| 2006/0165890 A1 | 7/2006 | Kaushal et al. | |
| 2006/0199357 A1 | 9/2006 | Wan et al. | |
| 2006/0286776 A1 | 12/2006 | Ranish et al. | |
| 2006/0286818 A1 | 12/2006 | Wang et al. | |
| 2007/0010071 A1 | 1/2007 | Matsuura | |
| 2007/0137572 A1 | 6/2007 | Matsuura et al. | |
| 2007/0167028 A1 | 7/2007 | Chou et al. | |
| 2007/0215036 A1 | 9/2007 | Park et al. | |
| 2007/0218701 A1 | 9/2007 | Shimizu et al. | |
| 2007/0232082 A1 | 10/2007 | Balseanu et al. | |
| 2007/0251444 A1 | 11/2007 | Gros et al. | |
| 2008/0038936 A1 | 2/2008 | Todd et al. | |
| 2008/0063791 A1 | 3/2008 | Hasebe et al. | |
| 2008/0075881 A1 | 3/2008 | Won et al. | |
| 2008/0139003 A1 * | 6/2008 | Pirzada et al. | 438/785 |
| 2008/0213479 A1 | 9/2008 | Chou et al. | |
| 2008/0242116 A1 | 10/2008 | Clark | |

(56) References Cited

U.S. PATENT DOCUMENTS

| | | | |
|---|---|---|---|
| 2008/0274302 A1 | 11/2008 | Hasebe et al. | |
| 2008/0311760 A1 | 12/2008 | Nodera et al. | |
| 2008/0317972 A1 | 12/2008 | Hendriks et al. | |
| 2009/0018668 A1 | 1/2009 | Galbraith | |
| 2009/0039349 A1 | 2/2009 | Honda | |
| 2009/0041952 A1 | 2/2009 | Yoon et al. | |
| 2009/0065896 A1 | 3/2009 | Hwang et al. | |
| 2009/0075490 A1 | 3/2009 | Dussarrat | |
| 2009/0148625 A1 | 6/2009 | Yeom et al. | |
| 2009/0155606 A1 | 6/2009 | Yoon et al. | |
| 2009/0163012 A1 | 6/2009 | Clark et al. | |
| 2009/0203197 A1 | 8/2009 | Hanawa et al. | |
| 2009/0208880 A1 | 8/2009 | Nemani et al. | |
| 2009/0278224 A1 | 11/2009 | Kim et al. | |
| 2010/0022099 A1 | 1/2010 | Van Nooten et al. | |
| 2010/0025824 A1 | 2/2010 | Chen et al. | |
| 2010/0096688 A1 | 4/2010 | Balseanu et al. | |
| 2010/0102417 A1 | 4/2010 | Ganguli et al. | |
| 2010/0124621 A1 | 5/2010 | Kobayashi et al. | |
| 2010/0136260 A1 | 6/2010 | Matsunaga et al. | |
| 2010/0136313 A1 | 6/2010 | Shimizu et al. | |
| 2010/0221925 A1 | 9/2010 | Lee et al. | |
| 2010/0304574 A1 | 12/2010 | Nodera et al. | |
| 2010/0310791 A1* | 12/2010 | Shimazu et al. | 427/579 |
| 2011/0003445 A1 | 1/2011 | Murata et al. | |
| 2011/0014795 A1 | 1/2011 | Lee et al. | |
| 2011/0014796 A1 | 1/2011 | Hayashi | |
| 2011/0014798 A1 | 1/2011 | Mallick et al. | |
| 2011/0086516 A1 | 4/2011 | Lee et al. | |
| 2011/0151142 A1 | 6/2011 | Seamons et al. | |
| 2011/0159202 A1 | 6/2011 | Matsushita et al. | |
| 2011/0256726 A1 | 10/2011 | LaVoie et al. | |
| 2011/0256734 A1 | 10/2011 | Hausmann et al. | |
| 2011/0298099 A1 | 12/2011 | Lee et al. | |
| 2012/0009802 A1 | 1/2012 | LaVoie et al. | |
| 2012/0009803 A1 | 1/2012 | Jung et al. | |
| 2012/0028454 A1 | 2/2012 | Swaminathan et al. | |
| 2012/0028469 A1 | 2/2012 | Onizawa et al. | |
| 2012/0058282 A1 | 3/2012 | Hong et al. | |
| 2012/0077349 A1 | 3/2012 | Li et al. | |
| 2012/0108079 A1 | 5/2012 | Mahajani | |
| 2012/0164846 A1 | 6/2012 | Ha et al. | |
| 2012/0213940 A1 | 8/2012 | Mallick | |
| 2012/0282418 A1 | 11/2012 | Chou et al. | |
| 2012/0315394 A1 | 12/2012 | Ito | |
| 2013/0040447 A1 | 2/2013 | Swaminathan et al. | |
| 2013/0071580 A1 | 3/2013 | Weidman et al. | |
| 2013/0115783 A1 | 5/2013 | Kim et al. | |
| 2013/0189854 A1 | 7/2013 | Hausmann et al. | |
| 2013/0196516 A1 | 8/2013 | Lavoie et al. | |
| 2013/0309415 A1 | 11/2013 | Swaminathan et al. | |
| 2013/0319329 A1 | 12/2013 | Li et al. | |
| 2014/0030444 A1 | 1/2014 | Swaminathan et al. | |
| 2014/0051262 A9 | 2/2014 | Lavoie et al. | |
| 2014/0106574 A1 | 4/2014 | Kang et al. | |
| 2014/0113457 A1 | 4/2014 | Sims et al. | |
| 2014/0120737 A1 | 5/2014 | Swaminathan et al. | |
| 2014/0134827 A1 | 5/2014 | Swaminathan et al. | |
| 2014/0141542 A1 | 5/2014 | Kang et al. | |
| 2014/0209562 A1 | 7/2014 | LaVoie et al. | |
| 2014/0216337 A1 | 8/2014 | Swaminathan et al. | |

FOREIGN PATENT DOCUMENTS

| | | |
|---|---|---|
| JP | 2010-10497 | 1/2010 |
| KR | 10-2001-0111448 | 12/2001 |
| KR | 10-2004-0001036 | 1/2004 |
| KR | 10-2009-0057665 | 6/2009 |
| KR | 10-2009-0080019 | 7/2009 |
| KR | 10-2009-0081396 | 7/2009 |
| WO | WO 2007/118026 | 10/2007 |
| WO | WO 2011/130326 | 10/2011 |
| WO | WO 2011/130397 | 10/2011 |
| WO | WO 2012/040317 | 3/2012 |
| WO | WO 2012/087737 | 6/2012 |
| WO | WO 2013/032786 | 3/2013 |
| WO | WO 2013/043330 | 3/2013 |
| WO | WO 2013/112727 | 8/2013 |

OTHER PUBLICATIONS

U.S. Appl. No. 13/953,616, filed Jul. 29, 2013, entitled "High Pressure, High Power Plasma Activated Conformal Film Deposition" [LAMRP004].

U.S. Appl. No. 14/061,587, filed Oct. 23, 2013, entitled "Sub-Saturated Atomic Layer Deposition and Conformal Film Deposition" [LAMRP020].

US Office Action dated Mar. 15, 2013 issued in U.S. Appl. No. 13/084,399.

US Final Office Action dated Sep. 13, 2013 issued in U.S. Appl. No. 13/084,399.

US Office Action dated Sep. 14, 2012 issued in U.S. Appl. No. 13/084,305.

US Final Office Action dated Apr. 25, 2013 issued in U.S. Appl. No. 13/084,305.

US Office Action dated Apr. 13, 2011 issued in U.S. Appl. No. 12/889,132.

US Notice of Allowance dated Sep. 30, 2011 issued in U.S. Appl. No. 12/889,132.

US Office Action dated Aug. 1, 2012 issued in U.S. Appl. No. 13/011,569.

US Final Office Action dated Feb. 26, 2013 issued in U.S. Appl. No. 13/011,569.

US Notice of Allowance dated May 6, 2013 issued in U.S. Appl. No. 13/011,569.

US Office Action dated Apr. 4, 2013 issued U.S. Appl. No. 13/242,084.

US Notice of Allowance dated Jun. 19, 2013 issued U.S. Appl. No. 13/242,084.

US Notice of Allowance dated Sep. 19, 2013 issued U.S. Appl. No. 13/242,084.

US Office Action dated Apr. 29, 2013 issued U.S. Appl. No. 13/224,240.

US Office Action dated Jun. 7, 2013 issued U.S. Appl. No. 13/414,619.

US Notice of Allowance dated Jul. 26, 2013 issued U.S. Appl. No. 13/414,619.

US Office Action dated May 24, 2013 issued U.S. Appl. No. 13/472,282.

US Notice of Allowance dated Oct. 4, 2013 issued U.S. Appl. No. 13/472,282.

PCT International Search Report and Written Opinion, dated Oct. 20, 2011, issued in PCT/US2011/032186.

PCT International Preliminary Report on Patentability dated Oct. 26, 2012, issued in PCT/US2011/032186.

PCT Invitation to Pay Additional Fees; Communication Re Partial International Search, dated Dec. 16, 2011, issued in PCT/US2011/032303.

PCT International Search Report and Written Opinion, dated Feb. 20, 2012, issued in PCT/US2011/032303.

PCT International Preliminary Report on Patentability and Written Opinion, dated Oct. 26, 2012, issued in PCT/US2011/032303.

PCT International Search Report and Written Opinion dated May 2, 2012 issued in Application No. PCT/US2011/052537.

PCT International Preliminary Report on Patentability and Written Opinion dated Apr. 4, 2013 issued in Application No. PCT/US2011/052537.

PCT International Search Report and Written Opinion dated Dec. 18, 2012, issued in Application No. PCT/US2012/052769.

PCT International Search Report and Written Opinion dated Feb. 28, 2013, issued in Application No. PCT/US2012/051740.

PCT International Search Report and Written Opinion dated May 27, 2013, issued in Application No. PCT/US2013/022977.

Cecchi et al., (2007) "Ultra-thin conformal pore-sealing of low-k materials by plasma-assisted ALD," University of New Mexico, Albuquerque, NM, Sandia National Labs, Albuquerque, NM, 1 page.

(56) References Cited

OTHER PUBLICATIONS

Choi, Gyu-Jin et al., (2009) "Plasma-enhanced atomic layer deposition of $TiO_2$ and Al-doped $TiO_2$ films using $N_2O$ and $O_2$ reactants," *Journal of the Electrochemical Society*, 156(9):G138-G143.

King, Sean W., (Jul./Aug. 2011) "Plasma enhanced atomic layer deposition of $SiN_x$:H and $SiO_2$," *J. Vac. Sci. Technol.* A29(4):9 pages.

Lee et al., (2005) "Chemically conformal deposition of $SrTiO_3$ thin films by Atomic Layer Deposition using conventional metal organic precursors and remote-plasma activated $H_O$," School of Materials Science and Engineering, and Inter-university Semiconductor Research Center, Seoul National University, *Microelectronic Engineering* 80:158-161.

Lee, Jong Ju, (2005) "Low-impurity, highly conformal atomic layer deposition of titanium nitride using $NH_3$—Ar—$H_2$ plasma treatment for capacitor electrodes," *Materials Letters*, 59:615-617.

Man P.F. et al., (Feb. 11-15, 1996) "Elimination of Post-Release Adhesion in Microstructures Using Conformal Fluorocarbon Coatings," *MEMES '96 Proceedings, IEEE*, pp. 55-60.

Nguyen, S.V. et al., (Jan./Mar. 1999) "Plasma-assist chemical vapor deposition of dielectric thin films for ULSI semiconductor circuits," *IBM J.Res.Develop.* 43(1.2):5-38.

Plasma Enhanced Atomic Layer Deposition (PEALD), Website: http://www.asm.com/index.php?option=com_content&task=view&id=19&Itemid=161 (2010), 1 page.

PlasmaPro™NGP®80 Range, Next Generation Plasma Systems, *Oxford Instruments* (2010), 8 pages.

U.S. Appl. No. 14/133,239, filed Dec. 18, 2013, entitled "Plasma Activated Conformal Dielectric Film Deposition".

U.S. Appl. No. 14/074,617, filed Nov. 7, 2013, entitled "Methods for Depositing Films on Sensitive Substrates" [LAMRP019].

U.S. Appl. No. 14/183,287, filed Feb. 18, 2014, entitled "High Growth Rate Process for Conformal Aluminum Nitride." [LAMRP082].

U.S. Appl. No. 14/187,145, filed Feb. 21, 2014, entitled "Plasma Assisted Atomic Layer Deposition Titanium Oxide for Conformal Encapsulation and Gap Fill Applications." [LAMRP083].

U.S. Appl. No. 14/195,653, filed Mar. 3, 2014, entitled "Rf Cycle Purging to Reduce Surface Roughness in Metal Oxide and Metal Nitride Films." [LAMRP084].

U.S. Appl. No.. 14/194,324, filed Feb. 28, 2014, entitled "Soft Landing Nanolaminates for Advanced Patterning." [LAMRP089].

U.S. Appl. No. 14/335,785, filed Jul. 18, 2014, entitled "Methods for Depositing Silicon Oxide." [LAMRP125].

US Notice of Allowance dated Jan. 15, 2014 issued in U.S. Appl. No. 13/084,399.

US Final Office Action dated Nov. 22, 2013 issued U.S. Appl. No. 13/224,240.

US Office Action dated May 21, 2014 issued in U.S. Appl. No. 13/607,386.

US Office Action dated Jun. 13, 2014 issued in U.S. Appl. No. 13/953,616 [LAMRP004].

US Office Action dated Jul. 10, 2014 issued in U.S. Appl. No. 14/144,107 [LAMRP072].

PCT International Preliminary Report on Patentability and Written Opinion dated Apr. 3, 2014, issued in Application No. PCT/US2012/052769.

PCT International Preliminary Report on Patentability and Written Opinion dated Mar. 13, 2014, issued in Application No. PCT/US2012/051740.

European Extended Search Report dated Apr. 14, 2014 issued in EP 13 15 2046.

Korean Notice of Provisional Rejection dated Dec. 6, 2013 issued in KR 10-2012-0043797.

Hausmann et al. (2002) "Atomic Layer Deposition of Hafnium and Zirconium Oxides Using Metal Amide Precursors," *Chem. Mater.* 14(10):4350-4358.

Kim, H., et al., (2002) "The Growth of Tantalum Thin Films by Plasma-Enhanced Atomic Layer Deposition and Diffusion Barrier Properties," *Mat. Res. Soc. Symp. Proc.* 716:B8.5.1-B8.5.6.

Ko, Myoung-Gyun, et al., "Characterization of ruthenium thin film deposited by rfdirect plasma atomic layer deposition," *209th ECS Meeting*, Abstract #50, p. 1 [Downloaded on Jun. 9, 2014].

Ko, Myoung-Gyun, et al., (Oct. 2008) "Correlation of Carbon Content with the Thermal Stability of Ruthenium Deposited by Using RF-Direct Plasma-Enhanced Atomic-Layer Deposition," *Journal of the Korean Physical Society*, 53(4):2123-2128.

Li, Xingcun, et al., (2011) "Atomic Layer Deposition $Al_2O_3$ Thin Films in Magnetized Radio Frequency Plasma Source," *Physics Procedia* 18:100-106.

van der Straten et al. (2004) "Atomic layer deposition of tantalum nitride for ultrathin liner applications in advanced copper metallization schemes," *Journal of Materials Research*, 19(2):447-453.

US Notice of Allowance dated Aug. 7, 2014 issued U.S. Appl. No. 14/133,239.

\* cited by examiner

US 9,070,555 B2

METHOD FOR DEPOSITING A CHLORINE-FREE CONFORMAL SiN FILM

CROSS-REFERENCE TO RELATED APPLICATION

This application is a continuation of and claims priority to U.S. patent application Ser. No. 13/414,619, filed Mar. 7, 2012, titled "METHOD FOR DEPOSITING A CHLORINE-FREE CONFORMAL SiN FILM," which claims priority to U.S. Provisional Application No. 61/588,964 filed Jan. 20, 2012, both of which are incorporated by reference herein in their entirety for all purposes.

INTRODUCTION

1. Field

The present disclosure relates generally to formation of SiN materials on substrates. More particularly, the disclosure relates to formation of SiN films on semiconductor substrates.

2. Background

Silicon nitride (SiN) thin films have unique physical, chemical and mechanical properties and thus are used in a variety of applications, particularly semiconductor devices, for example in diffusion barriers, gate insulators, sidewall spacers, encapsulation layers, strained films in transistors, and the like. One issue with SiN films is the relatively high temperatures used to form the films, for example, in Front End of Line (FEOL) applications, SiN films are typically deposited by chemical vapor deposition (CVD) in a reactor at greater than 750° C. using dichlorosilane and ammonia. However, as SiN films are used in late-stage semiconductor fabrication processes, and as device dimensions continue to shrink, there is an increasing demand for SiN films to be formed at lower temperatures, for example less than 600° C.

SUMMARY

Described are methods of making silicon nitride (SiN) materials on substrates. Improved SiN films made by the methods are also included. One aspect relates to depositing chlorine (Cl)-free conformal SiN films. In some embodiments, the SiN films are Cl-free and carbon (C)-free. Another aspect relates to methods of tuning the stress and/or wet etch rate of conformal SiN films. Another aspect relates to low-temperature methods of depositing high quality conformal SiN films. In some embodiments, the methods involve using trisilylamine (TSA) as a silicon-containing precursor.

One aspect is a method that includes periodically exposing the substrate to a vapor phase flow of a halogen-free silicon-containing reactant wherein the halogen-free silicon containing reactant is adsorbed onto the surface of the substrate, exposing the substrate to a vapor phase flow of a first nitrogen-containing reactant wherein the nitrogen-containing reactant is adsorbed onto the surface of the substrate, and periodically igniting a plasma in the reaction chamber when vapor phase nitrogen-containing reactant is present in the reaction chamber and the vapor phase flow of the halogen-free silicon-containing reactant has ceased. In some embodiments, the halogen-free silicon containing reactant is TSA. In certain embodiments, the first nitrogen-containing reactant is carbon-free. Examples of carbon-free nitrogen-containing reactants include ammonia or hydrazine. In certain embodiments, the first nitrogen-containing reactant is an amine, for example a $C_{1-10}$ alkyl amine. In certain embodiments, the first nitrogen-containing reactant is tert-butyl amine.

In some embodiments, the substrate is exposed to a vapor phase flow of a second nitrogen-containing reactant that is different from said first nitrogen-containing reactant. The first nitrogen-containing reactant can be carbon-free with the second nitrogen-containing reactant containing carbon. In certain embodiments, the volumetric flow ratio of the first nitrogen-containing reactant to the second nitrogen-containing reactant is between about 1:1 and 10:1, for example between about 1:1 and 4:1. In certain embodiments, the volumetric flow ratio of the first nitrogen-containing reactant to the second nitrogen-containing reactant is between about 1:10 and 1:1, for example between about 1:4 and 1:1.

In certain embodiments, the pressure in the reaction chamber is cycled such that it is higher during the vapor phase flow of the silicon-containing reactant. For example, the pressure in the reaction chamber can be cycled between a first pressure and a second pressure, the first pressure being between about 5 and 50 Torr and the second pressure between about 1 and 5 Torr.

In certain embodiments, the substrate is continuously exposed to the vapor phase flow of the first nitrogen-containing reactant through the method. In certain embodiments, the substrate is periodically exposed to the vapor phase flow of the first nitrogen-containing reactant.

In certain embodiments, low temperature processes are provided, with the temperature maintained at no more than about 400° C. or lower, for example no more than 375° C., 350° C. or 325° C. In certain embodiments, the stress of the silicon nitride material can be tuned. For example, a silicon nitride material having a stress between about −4 GPa and −2 GP can be deposited. In another example, a silicon nitride material having a stress between about −2 GPa and 1 GPa can be deposited. The silicon nitride material can be halogen-free. In certain embodiments, the silicon nitride material is halogen- and carbon-free.

One aspect of the invention relates to a method of forming a silicon nitride material on a substrate, including providing the substrate in a reaction chamber; exposing the substrate to a TSA reactant in the vapor phase so that the TSA reactant is adsorbed onto the surface of the substrate; exposing the substrate to a nitrogen-containing reactant in the vapor phase so that the nitrogen-containing reactant is adsorbed onto the surface of the substrate; and igniting a plasma while the nitrogen-containing reactant is present in the vapor phase. The substrate surface can include a raised or recessed feature. The substrate can include one or more of a metal such as copper, a dielectric material such as silicon oxide, or a germanium-antimony-tellurium (GST) alloy, for example. In some embodiments, the nitrogen-containing reactant is a carbon-free nitrogen containing reactant such as ammonia or hydrazine. In some embodiments, the nitrogen-containing reactant is a carbon-containing reactant. In some embodiments, the nitrogen-containing reactant is a mixture of a carbon-containing reactant and carbon-free nitrogen-containing reactant. The substrate temperature can be, for example, between about 300° C. and about 450° C., or between about 300° C. and about 400° C. In some embodiments, the temperature is less than 400° C. RF power can be between about 0.15-0.5 W/cm² in some embodiments.

Another aspect relates to an apparatus for depositing a silicon nitride film. The apparatus can include a reaction chamber; a source of activation energy to form the silicon nitride film; a reactant inlet; and a controller. The controller can include instructions for flowing first and second nitrogen-containing reactants into the reaction chamber during a deposition cycle; periodically flowing a halogen-free silicon-containing reactant into the reaction chamber during the deposition cycle; and periodically igniting a plasma in the reaction chamber when the flow of the silicon-containing reactant has ceased and while the first and second nitrogen-containing reactants are present in the vapor phase in the reaction chamber.

These and other features and advantages of the present invention will be described in more detail below with reference to the associated drawings.

DETAILED DESCRIPTION

Overview

Figure 1:
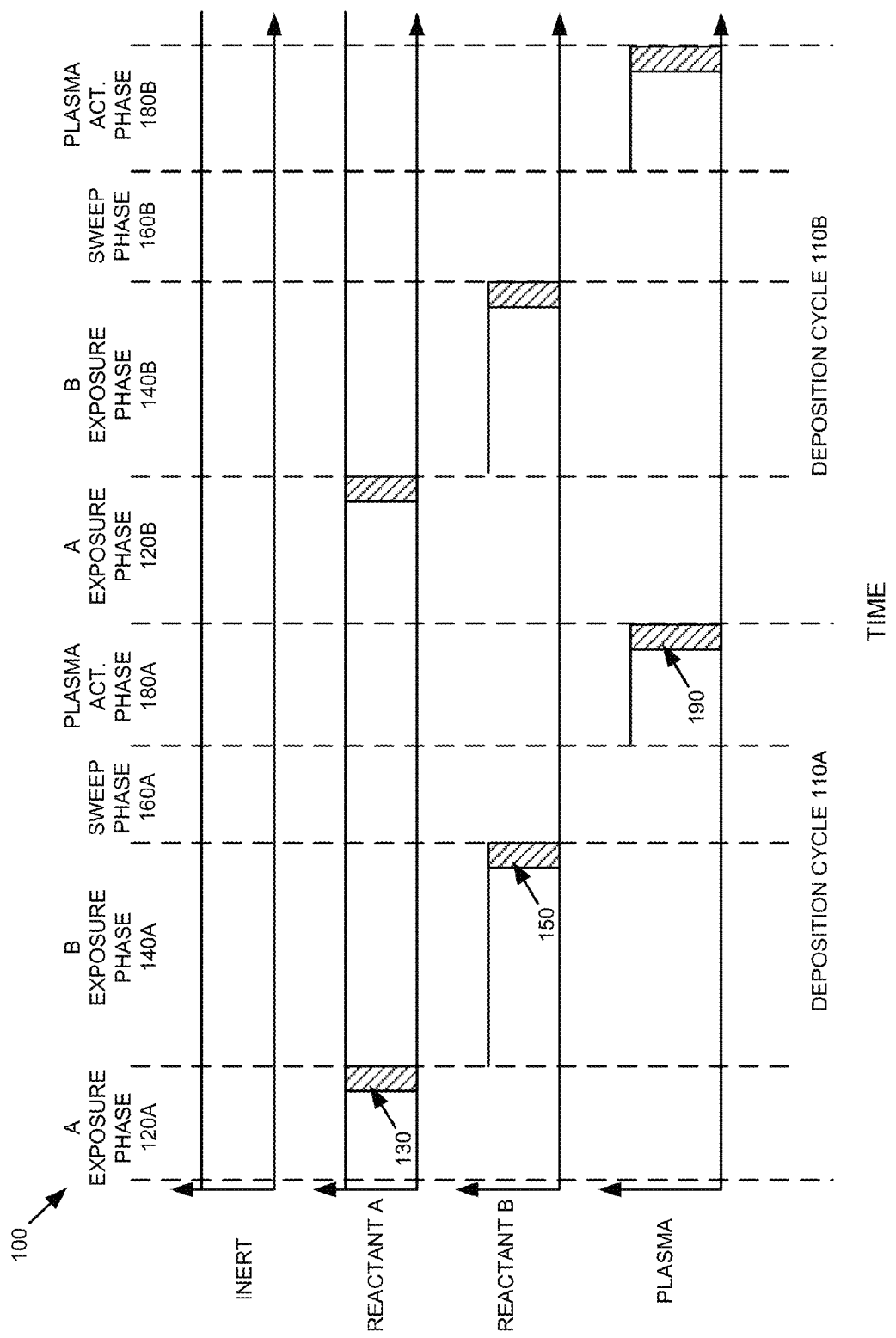
FIG. 1 shows a temporal progression of exemplary phases in a CFD process.

The present disclosure relates to formation of SiN films, particularly on semiconductor substrates. Methods described herein include ways of controlling the carbon content in SiN films, particularly forming low-carbon content SiN films, as well as conformal film deposition (CFD) methods of forming SiN films.

DEFINITIONS

As used herein, the following definitions shall apply unless otherwise indicated.

A "silicon-containing reactant" is a reagent, single or mixture of reagents, used to make a SiN material, where the reagent contains at least one silicon compound. The silicon compound can be, for example, a silane, a halosilane or an aminosilane. A silane contains hydrogen and/or carbon groups, but does not contain a halogen. Examples of silanes are silane ($SiH_4$), disilane ($Si_2H_6$), and organo silanes such as methylsilane, ethylsilane, isopropylsilane, t-butylsilane, dimethylsilane, diethylsilane, di-t-butylsilane, allylsilane, sec-butylsilane, thexylsilane, isoamylsilane, t-butyldisilane, di-t-butyldisilane, and the like. A halosilane contains at least one halogen group and may or may not contain hydrogens and/or carbon groups. Examples of halosilanes are iodosilanes, bromosilanes, chlorosilanes and fluorosilanes. Although halosilanes, particularly fluorosilanes, may form reactive halide species that can etch silicon materials, in certain embodiments described herein, the silicon-containing reactant is not present when a plasma is struck. Specific chlorosilanes are tetrachlorosilane ($SiCl_4$), trichlorosilane ($HSiCl_3$), dichlorosilane ($H_2SiCl_2$), monochlorosilane ($ClSiH_3$), chloroallylsilane, chloromethylsilane, dichloromethylsilane, chlorodimethylsilane, chloroethylsilane, t-butylchlorosilane, di-t-butylchlorosilane, chloroisopropylsilane, chloro-sec-butylsilane, t-butyldimethylchlorosilane, thexyldimethylchlorosilane, and the like. An aminosilane includes at least one nitrogen atom bonded to a silicon atom, but may also contain hydrogens, oxygens, halogens and carbons. Examples of aminosilanes are mono-, di-, tri- and tetra-aminosilane ($H_3Si$ $(NH_2)_4$, $H_2Si(NH_2)_2$, $HSi(NH_2)_3$ and $Si(NH_2)_4$, respectively), as well as substituted mono-, di-, tri- and tetra-aminosilanes, for example, t-butylaminosilane, methylaminosilane, tert-butylsilanamine, bis(tertiarybutylamino)silane ($SiH_2(NHC(CH_3)_3)_2$ (BTBAS), tert-butyl silylcarbamate, $SiH(CH_3)$—$(N(CH_3)_2)_2$, $SiHCl$—$(N(CH_3)_2)_2$, $(Si(CH_3)_2NH)_3$ and the like. A further example of an aminosilane is trisilylamine ($N(SiH_3)$).

A "nitrogen-containing reactant" contains at least one nitrogen, for example, ammonia, hydrazine, amines (amines bearing carbon) such as methylamine, dimethylamine, ethylamine, isopropylamine, t-butylamine, di-t-butylamine, cyclopropylamine, sec-butylamine, cyclobutylamine, isoamylamine, 2-methylbutan-2-amine, trimethylamine, diisopropylamine, diethylisopropylamine, di-t-butylhydrazine, as well as aromatic containing amines such as anilines, pyridines, and benzylamines. Amines may be primary, secondary, tertiary or quaternary (for example, tetraalkylammonium compounds). A nitrogen-containing reactant can contain heteroatoms other than nitrogen, for example, hydroxylamine, t-butyloxycarbonyl amine and N-t-butyl hydroxylamine are nitrogen-containing reactants.

"Plasma" refers to a plasma ignited in a reaction chamber or remotely and brought into the reaction chamber. Plasmas can include the reactants described herein and may include other agents, for example, a carrier gas, or reactive species such as hydrogen gas. The reactants and other agents may be present in a reaction chamber when a plasma is struck, or a remote plasma may be flowed into a chamber where the reactants are present and/or the reactants and/or carrier gas may be ignited into a plasma remotely and brought into the reaction chamber. A "plasma" is meant to include any plasma known to be technologically feasible, including inductively-coupled plasmas and microwave surface wave plasmas. One of ordinary skill in the art would appreciate that advancements in technology will occur, and thus as yet developed plasma generating techniques are contemplated to be within the scope of the invention.

"Thermally removable group" refers to a moiety, on either or both of the nitrogen-containing reactant and the silicon-containing reactant, that breaks down into volatile components at between about 200° C. and about 550° C. Described herein are non-limiting examples such as secondary and tertiary carbon group, which undergo elimination reactions in this temperature range. One of ordinary skill in the art would recognize that other groups thermally decompose as described by other mechanisms, for example, a t-butyloxycarbonyl (t-BOC or "BOC") group thermally decomposes via both an elimination mechanism where the t-butyl portion of the group forms isobutylene, but also the decomposition forms carbon dioxide. Thus a thermally removable group is not limited to a particular mechanism or combination of mechanisms. As long as the group breaks down under the specified temperature range to produce at least one volatile component, then it qualifies as a thermally decomposable group. For example, under a given set of conditions, t-butylethylamine will undergo thermal decomposition of the t-butyl group to form isobutylene while the ethyl group remains, and thus isobutylene and ethylamine are the products of the thermal decomposition. One of ordinary skill in the art would recognize that the volatility of a component depends, in part, on the reaction conditions under which the component is generated. For example, isobutylene may be volatile and be removed from a reaction chamber under the conditions of heating and low press because it does not react with the adsorbed reactants, while, for example, ammonia, although generally a volatile compound, undergoes reaction with a silicon-containing reactant adsorbed on the surface of a substrate.

Methods

Described herein are methods of making SiN films. In particular embodiments SiN films are made using plasma-activated conformal film deposition (CFD). In some embodiments, SiN films are deposited using an aminosilane silicon-containing reactant. In some embodiments, SiN films are deposited using non-halogen aminosilanes. In some embodiments, SiN films are deposited using trisilylamine.

In some embodiments, SiN films are deposited using a carbon-free nitrogen-containing reactant. In some embodiments, SiN films are deposited using ammonia. In some embodiments, SiN films are deposited using a mixture of a carbon-free compound nitrogen-containing reactant and a carbon-containing nitrogen-containing reactant.

In some embodiments, halogen-free conformal SiN films are deposited. In some embodiments, halogen- and carbon-free conformal SiN films are deposited. In some embodiments, halogen-free conformal SiN films having a tuned stress are deposited. In some embodiments, conformal SiN films are deposited at temperatures less than about 400° C. Each of these aspects is described in more detail below.

In certain embodiments, CFD is used to deposit the SiN films, although methods described herein are not limited to CFD. Other suitable methods include ALD, PEALD, CVD, PECVD, and plasma enhanced cyclic chemical vapor deposition (PECCVD). Methods for forming films using CFD are described in U.S. patent application Ser. No. 13/084,399, filed on Apr. 11, 2011, and which is incorporated by reference herein for all purposes. For context, a short description of CFD is provided.

Manufacture of semiconductor devices typically involves depositing one or more thin films on a non-planar substrate in an integrated fabrication process. In some aspects of the integrated process it may be useful to deposit conformal thin films. For example, a silicon nitride film may be deposited on top of an elevated gate stack to act as a spacer layer for protecting lightly-doped source and drain regions from subsequent ion implantation processes.

In spacer layer deposition processes, chemical vapor deposition (CVD) processes may be used to form a silicon nitride film on the non-planar substrate, which is then anisotropically etched to form the spacer structure. However, as a distance between gate stacks decreases, mass transport limitations of CVD gas phase reactions may cause "bread-loafing" deposition effects. Such effects typically exhibit thicker deposition at top surfaces of gate stacks and thinner deposition at the bottom corners of gate stacks. Further, because some die may have regions of differing device density, mass transport effects across the wafer surface may result in within-die and within-wafer film thickness variation. These thickness variations may result in over-etching of some regions and under-etching of other regions. This may degrade device performance and/or die yield.

Some approaches to addressing these issues involve atomic layer deposition (ALD). In contrast with a CVD process, where thermally activated gas phase reactions are used to deposit films, ALD processes use surface-mediated deposition reactions to deposit films on a layer-by-layer basis. In one example ALD process, a substrate surface, including a population of surface active sites, is exposed to a gas phase distribution of a first reactant (A). Some molecules of reactant A may form a condensed phase atop the substrate surface, including chemisorbed species and physisorbed molecules of reactant A. The reactor is then evacuated to remove gas phase and physisorbed reactant A so that only chemisorbed species remain. A second film reactant (B) is then introduced to the reactor so that some molecules of reactant B adsorb to the substrate surface. Thermal energy provided to the substrate activates surface reactions between adsorbed molecules of reactants A and B, forming a film layer. Finally, the reactor is evacuated to remove reaction by-products and unreacted reactant B, ending the ALD cycle. Additional ALD cycles may be included to build film thickness. Plasma, or other energetic means, may be used in conjunction with heating, or as alternatives to heating the substrate in order to drive the reaction between reactant A and B.

Depending on the exposure time of the reactant dosing steps and the sticking coefficients of the reactants, each ALD cycle may deposit a film layer of, in one example, between one-half and three angstroms thick. Thus, ALD processes may be time consuming when depositing films more than a few nanometers thick. Further, some reactants may have long exposure times to deposit a conformal film, which may also reduce wafer throughput time.

Conformal films may also be deposited on planar substrates. For example, antireflective layers for lithographic patterning applications may be formed from planar stacks comprising alternating film types. Such antireflective layers may be approximately 100 to 1000 angstroms thick, making ALD processes less attractive than CVD processes. However, such anti-reflective layers may also have a lower tolerance for within-wafer thickness variation than many CVD processes may provide. For example, a 600-angstrom thick antireflective layer may tolerate a thickness range of less than 3 angstroms.

Various embodiments described herein include CFD to deposit SiN films. Generally, CFD does not rely on complete purges of one or more reactants prior to reaction to form SiN. For example, there may be one or more reactants present in the vapor phase when a plasma (or other activation energy) is struck. Accordingly, one or more of the process steps described in the ALD process may be shortened or eliminated in an example CFD process. Further, in some embodiments, plasma activation of deposition reactions may result in lower deposition temperatures than thermally-activated reactions, potentially reducing the thermal budget of an integrated process.

FIG. 1, shows a temporal progression of exemplary phases in a CFD process, 100, for various process parameters, for example, inert gas flow, reactant A, reactant B and when a plasma is struck. In FIG. 1, two deposition cycles 110A and 110B are shown. One of ordinary skill in the art would appreciate that any suitable number of deposition cycles may be included in a CFD process to deposit a desired film thickness. Example CFD process parameters include, but are not limited to, flow rates for inert and reactant species, plasma power and frequency, substrate temperature, and process station pressure.

The concept of a CFD "cycle" is relevant to the discussion of various embodiments herein. Generally a cycle is the minimum set of operations required to perform a surface deposition reaction one time. The result of one cycle is production of at least a partial film layer on a substrate surface. Typically, a CFD cycle will include only those steps necessary to deliver and adsorb each reactant to the substrate surface, and then react those adsorbed reactants to form the partial layer of film. The cycle may include certain ancillary steps such as sweeping one of the reactants or byproducts and/or treating the partial film as deposited. Generally, a cycle contains only one instance of a unique sequence of operations. As an example, a cycle may include the following operations: (i) delivery/ adsorption of reactant A, (ii) delivery/adsorption of reactant B, (iii) sweep B out of the reaction chamber, and (iv) apply plasma to drive a surface reaction of A and B to form the partial film layer on the surface.

Referring to FIG. 1, an inert gas is flowed during all phases of process 100. At reactant A exposure phase, 120A, reactant A is supplied at a controlled flow rate to a process station to saturate exposed surfaces of a substrate. Reactant A may be any suitable deposition reactant, for example, a nitrogen-containing reactant. In the embodiment shown in FIG. 1, reactant A flows continuously throughout deposition cycles 110A and 110B. Unlike a typical ALD process, where film precursor (reactant) exposures are separated to prevent gas phase reaction, reactants A and B may be allowed to mingle in the gas phase of some embodiments of a CFD process. Continuously supplying reactant A to the process station may reduce or eliminate a reactant A flow rate turn-on and stabilization time compared to an ALD process where reactant A is first turned on, then stabilized and exposed to the substrate, then turned off, and finally removed from a reactor. While the embodiment shown in FIG. 1 depicts reactant A exposure phase 120A as having a constant flow rate, it will be appreciated that any suitable flow of reactant A, including a variable flow, may be employed within the scope of the present disclosure. In some embodiments, reactant A exposure phase 120A may have a duration that exceeds a substrate surface saturation time for reactant A. For example, the embodiment of FIG. 1 includes a reactant A post-saturation exposure time 130 in reactant A exposure phase 120A. Optionally, reactant A exposure phase 120A may include a controlled flow rate of an inert gas. Example inert gases include, but are not limited to, nitrogen, argon, and helium. The inert gas may be provided to assist with pressure and/or temperature control of the process station, evaporation of a liquid reactant, more rapid delivery of the reactant and/or as a sweep gas for removing process gases from the process station and/or process station plumbing.

At reactant B exposure phase 140A of the embodiment shown in FIG. 1, reactant B is supplied at a controlled flow rate to the process station to saturate the exposed substrate surface. In this example, reactant B can be a nitrogen-containing reactant, for example. While the embodiment of FIG. 1 depicts reactant B exposure phase 140A as having a constant flow rate, it will be appreciated that any suitable flow of reactant B, including a variable flow, may be employed within the scope of the present disclosure. Further, it will be appreciated that reactant B exposure phase 140A may have any suitable duration. In some embodiments, reactant B exposure phase 140A may have a duration exceeding a substrate surface saturation time for reactant B. For example, the embodiment shown in FIG. 1 depicts a reactant B post-saturation exposure time 150 included in reactant B exposure phase 140A.

In some embodiments, surface adsorbed B species may exist as discontinuous islands on the substrate surface, making it difficult to achieve surface saturation of reactant B. Various surface conditions may delay nucleation and saturation of reactant B on the substrate surface. For example, ligands released on adsorption of reactants A and/or B may block some surface active sites, preventing further adsorption of reactant B. Accordingly, in some embodiments, continuous adlayers of reactant B may be provided by modulating a flow of and/or discretely pulsing reactant B into the process station during reactant B exposure phase 140A. This may provide extra time for surface adsorption and desorption processes while conserving reactant B compared to a constant flow scenario. Additionally, or alternatively, in some embodiments, one or more sweep phases may be included between consecutive exposures of reactant B.

Prior to activation of the plasma, gas phase reactant B may be removed from the process station in sweep phase 160A in some embodiments. Sweeping the process station may avoid gas phase reactions where reactant B is unstable to plasma activation or where unwanted species might be formed. Further, sweeping the process station may remove surface adsorbed ligands that may otherwise remain and contaminate the film. Example sweep gases may include, but are not limited to, argon, helium, and nitrogen. In the embodiment shown in FIG. 1, sweep gas for sweep phase 160A is supplied by the continuous inert gas stream. In some embodiments, sweep phase 160A may include one or more evacuation subphases for evacuating the process station. Alternatively, it will be appreciated that sweep phase 160A may be omitted in some embodiments.

Sweep phase 160A may have any suitable duration. In some embodiments, increasing a flow rate of a one or more sweep gases may decrease the duration of sweep phase 160A. For example, a sweep gas flow rate may be adjusted according to various reactant thermodynamic characteristics and/or geometric characteristics of the process station and/or process station plumbing for modifying the duration of sweep phase 160A. In one non-limiting example, the duration of a sweep phase may be optimized by adjustment of the sweep gas flow rate. This may reduce deposition cycle time, which may improve substrate throughput.

At plasma activation phase 180A of the embodiment shown in FIG. 1, plasma energy is provided to activate surface reactions between surface adsorbed reactants A and B. For example, the plasma may directly or indirectly activate gas phase molecules of reactant A to form reactant A radicals. These radicals may then interact with surface adsorbed reactant B, resulting in film-forming surface reactions. Plasma activation phase 180A concludes deposition cycle 110A, which in the embodiment of FIG. 1 is followed by deposition cycle 110B, commencing with reactant A exposure phase 120B, and continuing with B exposure phase 140B, sweep phase 160B and plasma activation phase 180B.

In some embodiments, the plasma ignited in plasma activation phase 180A may be formed directly above the substrate surface. This may provide a greater plasma density and enhance a surface reaction rate between reactants A and B. For example, plasmas for CFD processes may be generated by applying a radio frequency (RF) field to a low-pressure gas using two capacitively coupled plates. Any suitable gas may be used to form the plasma. In this example, the inert gas such as argon or helium is used along with reactant A, a nitrogen-containing reactant, to form the plasma. Ionization of the gas between the plates by the RF field ignites the plasma, creating free electrons in the plasma discharge region. These electrons are accelerated by the RF field and may collide with gas phase reactant molecules. Collision of these electrons with reactant molecules may form radical species that participate in the deposition process. It will be appreciated that the RF field may be coupled via any suitable electrodes. Non-limiting examples of electrodes include process gas distribution showerheads and substrate support pedestals. It will be appreciated that plasmas for CFD processes may be formed by one or more suitable methods other than capacitive coupling of an RF field to a gas.

Plasma activation phase 180A may have any suitable duration. In some embodiments, plasma activation phase 180A may have a duration that exceeds a time for plasma-activated radicals to interact with all exposed substrate surfaces and adsorbates, forming a continuous film atop the substrate surface. For example, the embodiment shown in FIG. 1 includes a plasma post-saturation exposure time 190 in plasma activation phase 180A.

In some embodiments, extending a plasma exposure time and/or providing a plurality of plasma exposure phases may provide a post-reaction treatment of bulk and/or near-surface portions of the deposited film. In one embodiment, decreasing surface contamination may prepare the surface for adsorption of reactant A. For example, a silicon nitride film formed from reaction of a silicon-containing reactant and a nitrogen-containing reactant may have a surface that may resist adsorption of subsequent reactants. Treating the silicon nitride surface with a plasma may create hydrogen bonds for facilitating subsequent adsorption and reaction events. The SiN films described herein can be exposed to other-than-plasma treatments.

In some embodiments, a treatment other than a plasma treatment is employed to modify the properties the as deposited film. Such treatments include electromagnetic radiation treatments, thermal treatments (e.g., anneals or high temperature pulses), and the like. Any of these treatments may be performed alone or in combination with another treatment, including a plasma treatment. Any such treatment can be employed as a substitute for any of the above-described plasma treatments. In a specific embodiment, the treatment involves exposing the film to ultraviolet radiation. As described below, in a specific embodiment, the method involves the application of UV-radiation to a film in situ (i.e., during formation of the film) or post deposition of the film. Such treatment serves to reduce or eliminate defect structure and provide improved electrical performance.

In certain specific embodiments, a UV treatment can be coupled with a plasma treatment. These two operations can be performed concurrently or sequentially. In the sequential option, the UV operation optionally takes place first. In the concurrent option, the two treatments may be provided from separate sources (e.g., an RF power source for the plasma and a lamp for the UV) or from a single source such as a helium plasma that produces UV radiation as a byproduct.

In some embodiments, film properties, such as film stress, dielectric constant, refractive index, etch rate may be adjusted by varying plasma parameters.

While many examples discussed herein include two reactants (A and B), it will be appreciated that any suitable number of reactants may be employed within the scope of the present disclosure. In some embodiments, a single reactant and an inert gas used to supply plasma energy for a surface reaction can be used. Alternatively, some embodiments may use multiple reactants to deposit a film. For example, in some embodiments, a silicon nitride film may be formed by reaction of a silicon-containing reactant and one or more of a nitrogen-containing reactant, or one or more silicon-containing reactants and a single nitrogen-containing reactant, or more than one of both the silicon-containing reactant and the nitrogen-containing reactant.

In certain embodiments, a halogen-free silicon-containing reactant is employed to deposit a halogen-free SiN film. FIG. 1 provides an example of a process that may be used to deposit a halogen-free SiN film, with trisilylamine (TSA) is employed as a reactant B in the example of FIG. 1. While FIG. 1 provides an example of a process to deposit a SiN film, various modifications possible. For example, in some embodiments, flows of reactant A and B may be alternated with optional purge gases in between the flows. In another example, reactant A can be a silicon-containing reactant, with reactant B a nitrogen-containing reactant. In some embodiments, a plasma may be struck only when the flow of the silicon-containing reactant is stopped.

In certain embodiments, a halogen-free silicon-containing reactant is employed. In a particular example, trisilylamine (TSA) is employed as a silicon-containing reactant. TSA is an isolatable, stable aminosilane.

Figure 2:
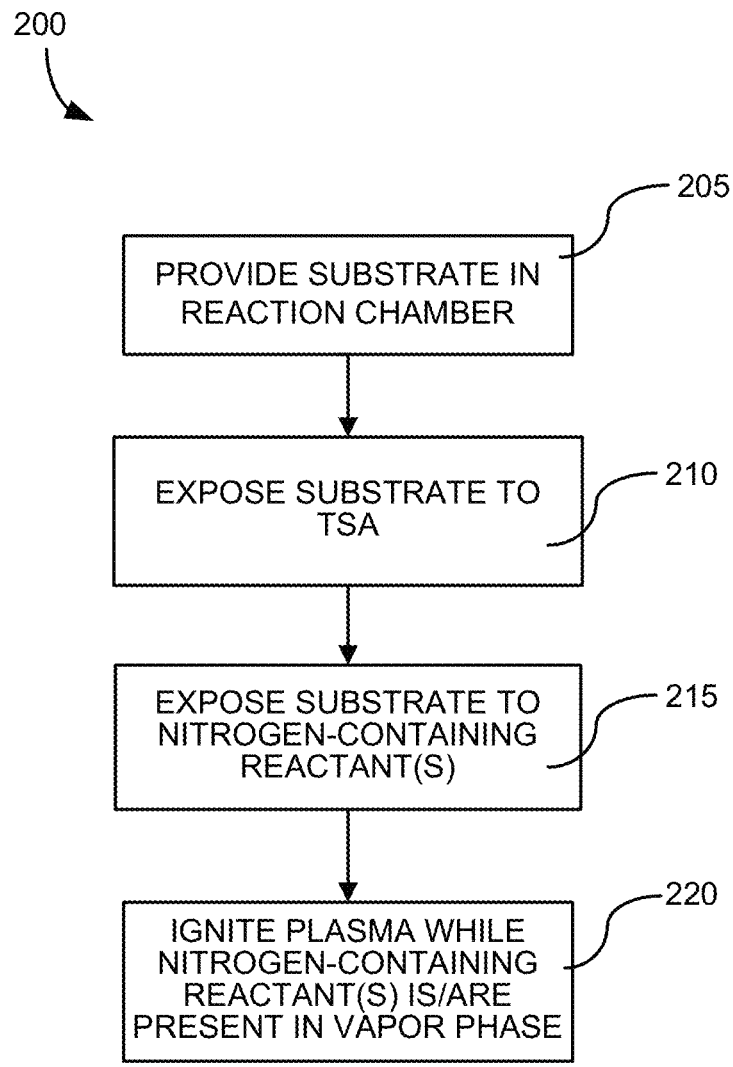
FIG. 2-4 show example process flows for making a SiN film.
Figure 3:
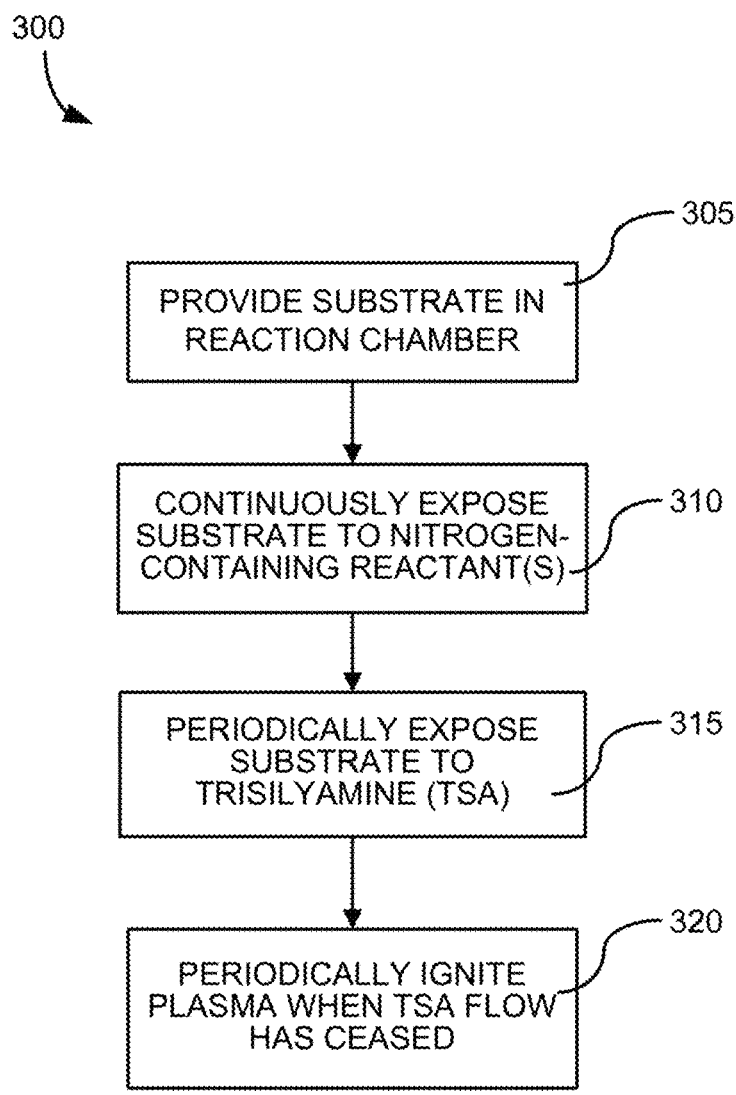

FIGS. 2 and 3 depict examples of process flows 200 and 300 that use TSA. First turning to FIG. 2, a substrate is provided to a chamber, see 205. The substrate can be any appropriate substrate on which a SiN film is desired. For example, the substrate can be a partially fabricated integrated circuit, flash memory or phase-change memory substrate. The substrate can be provided as a bare substrate, e.g., a bare silicon substrate, or with one or more layers deposited thereon. The surface on which the SiN film is to be deposited can be or include, for example, silicon, polysilicon, copper, titanium, tungsten, silicon dioxide, or a germanium-antimony-tellurium (GST) alloy. In some embodiments, the surface includes one or more raised or recessed features. The one or more raised features can have aspect ratios of 2:1-10:1, for example. The substrate is exposed to TSA, see 210. In some embodiments, operation 210 is a non-plasma operation. The reactor can be pressurized, in some embodiments, to a first pressure between about 5 and 50 Torr, for example. In a particular embodiment, pressure is about 20 Torr during operation 210. Pressures outside this range may be used according to the desired embodiment. TSA is adsorbed on the substrate surface. After the desired amount of TSA is adsorbed on the surface, the flow of TSA is stopped (not shown). The substrate is then exposed to one or more nitrogen-containing reactants, see 215. A plasma is struck while the nitrogen-containing reactant is present in the vapor phase, see 220, thus forming a halogen-free SiN film on the substrate. In some embodiments, the pressure in the reactor is cycled such that it is lower during operations 215 and/or 220 than operation 210. For example, the pressure during these operations can be between about 1 and 5 Torr, for example 2 Torr. The flow of the nitrogen-containing reactant(s) can be stopped (not shown) after 220 in some embodiments.

In one embodiment, the TSA not adsorbed to the surface of the substrate is swept out of the chamber by the flow of the inert gas and/or nitrogen-containing reactant(s) prior to striking the plasma. In another embodiment, a purge may be used to remove vapor phase silicon-containing reactant. In some embodiments, a purge may be used after 220 as well.

One or more iterations of 210-220 can be performed to build up a SiN layer. In one embodiment, these operations are repeated to form a conformal layer on the substrate between about 1 nm and about 100 nm thick. In another embodiment, between about 5 nm and about 50 nm thick. In another embodiment, between about 5 nm and about 30 nm thick.

In one embodiment, using any of the methods described herein, the substrate is heated to between about 50° C. and about 550° C., or more particularly from about 300° C. to about 450° C., for example about 350° C. or 400° C. In one embodiment, the wafer is heated throughout the deposition, in other embodiments the wafer is heated periodically during the deposition or after the deposition steps as an anneal.

FIG. 3 depicts a process flow, 300, outlining aspects of an embodiment of the method. A substrate is provided to the chamber, see 305. A flow of one or more nitrogen-containing reactants is established and continued throughout 300, see 310. The substrate is periodically exposed to TSA, see 315. Also, periodically, a plasma is struck, see 320, but only when the TSA reactant flow has ceased. In one embodiment, the TSA not adsorbed to the surface of the substrate is swept out of the chamber by the flow of an inert gas and/or nitrogen-containing reactant(s). In another embodiment, a purge may be used. After the plasma treatment, the cycle is complete. Operations 310-320 may be repeated a number of times to build up a layer of desired thickness.

Figure 4:
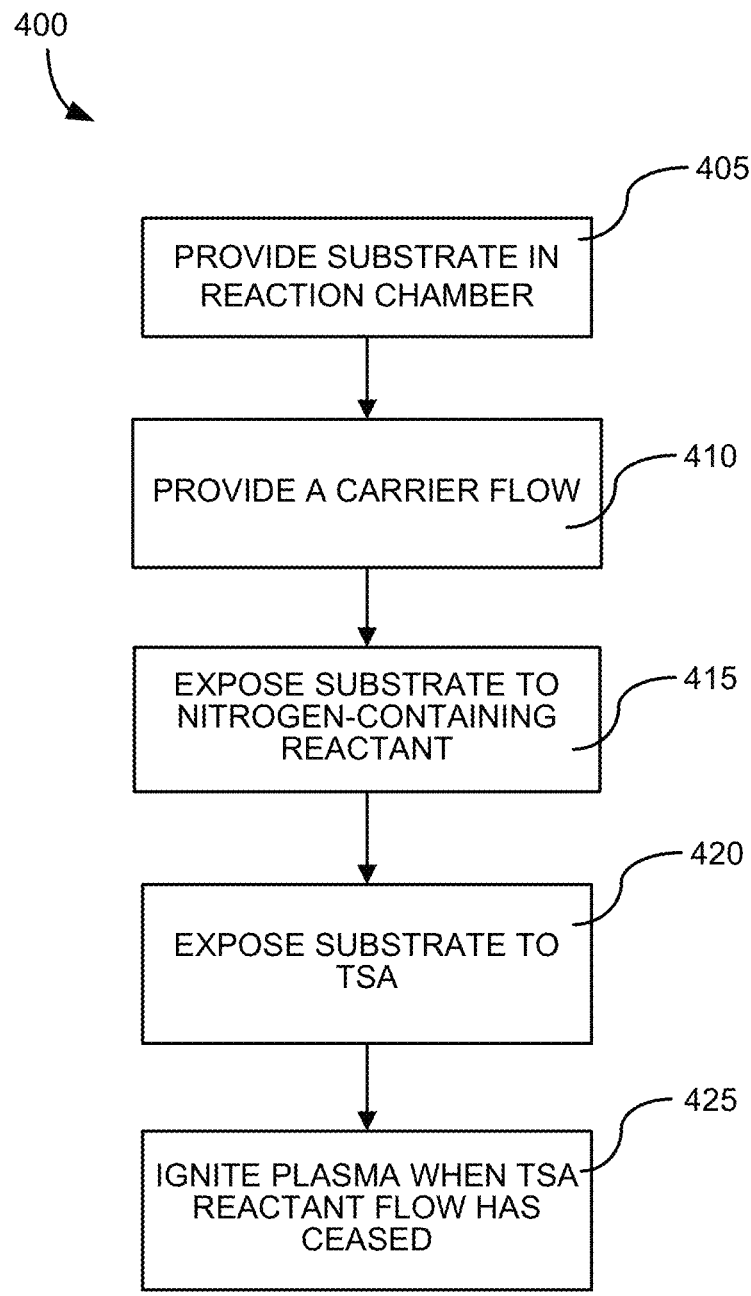

FIG. 4 depicts a process flow 400, outlining aspects of an embodiment of a method. A substrate is provided to the chamber, see 405. A carrier flow is established, see 410. The substrate is exposed to a nitrogen-containing reactant, see 415. The substrate is exposed to a silicon-containing reactant, see 420. A plasma is ignited after the flow of the silicon-containing reactant is ceased, see 425. This reaction forms SiN. One or more iterations of 410-425 are performed to build a layer of desired thickness. In this method, 415 and 420 are not necessarily done in the order presented. The nitrogen-containing reactant flow may or may not be continuous.

Various additional operations may be incorporated into any of the above-described processes. For example, in some embodiments, after all or part of the SiN film is formed to a desired thickness, the SiN film can be exposed to a hydrogen plasma. This can remove carbon content, if any, from the SiN film. In one embodiment, the hydrogen plasma is generated using hydrogen ($H_2$) and a carrier gas such as nitrogen, helium or argon. Other hydrogen containing gases, or active hydrogen atoms produced by a remote plasma source, may be used to treat the deposited film. Further, in some embodiments, the carbon content of the film may be tuned to any suitable concentration by varying one or more of the number of treatment pulses and their duration, the intensity of the treatment plasma, the substrate temperature, and the treatment gas composition.

Halogen-Free Silicon-Containing Reactants

While FIGS. 2-4 provide example process flows for deposition of SiN using TSA, in some embodiments, other SiN films are deposited using non-halogen aminosilanes may be used instead of or in addition to TSA. The TSA or other aminosilane may be unsubstituted or optionally substituted with any non-halogen substituent. In some embodiments, unsubstituted TSA $(SiH_3)_3N$ is used. In some embodiments, TSA substituted with one or more carbon-containing substituents may be used. Examples of carbon-containing substituents include alkyl, alkenyl, alkynyl, and other organic groups.

The use of a halogen-free silicon-containing reactant can be advantageous for deposition on certain substrates that are especially susceptible to etching and/or corrosion by halide byproducts of the deposition process. These include metal substrates such as copper, tungsten, titanium substrates and GST alloys. For example, tungsten and a chloride byproduct may react to form volatile tungsten hexachloride, removing the underlying tungsten. In another example, a chloride gas may corrode copper.

The use of a halogen-free silicon-containing reactant can also be useful for low temperature (e.g., 400° C. and less than 400° C.) reactions. This is because halogen-containing silicon reactants can produce solid byproducts, such as $NH_4Cl$ that cannot be removed as volatile byproducts in low temperature reactions. TSA can be used for low temperature reactions as it more reactive at the surface than, for example, dichlorosilane (DCS).

In some embodiments, TSA may be used with any suitable nitrogen-containing reactant. In one embodiment, the nitrogen-containing reactant is selected from the group consisting of ammonia, a hydrazine, an amine and mixtures thereof. In one embodiment, the nitrogen-containing reactant includes a $C_{1-10}$ alkyl amine or a mixture of $C_{1-10}$ alkyl amines. In one embodiment, the $C_{1-10}$ alkyl amine is a primary alkyl amine or a secondary alkyl amine. In one embodiment, the $C_{1-10}$ alkyl amine is a primary alkyl amine. In one embodiment, the $C_{1-10}$ alkyl amine is according to formula I:

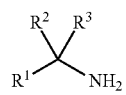

I wherein each of $R^1$, $R^2$ and $R^3$ is, independent of the others, H or $C_{1-3}$ alkyl; or two of $R^1$, $R^2$ and $R^3$, together with the carbon atom to which they are attached form a $C_{3-7}$ cycloalkyl and the other of $R^1$, $R^2$ and $R^3$ is H or $C_{1-3}$ alkyl. In one embodiment, the $C_{1-10}$ alkyl amine has a secondary or tertiary carbon attached directly to the nitrogen. In one embodiment, the $C_{1-10}$ alkyl amine is selected from the group consisting of isopropylamine, cyclopropylamine, sec-butylamine, tert-butyl amine, cyclobutylamine, isoamylamine, 2-methylbutan-2-amine and thexylamine (2,3-dimethylbutan-2-amine). In one embodiment, in the $C_{1-10}$ alkyl amine of Formula I, each of $R^1$, $R^2$ and $R^3$ is $C_{1-3}$ alkyl. In one embodiment, the $C_{1-10}$ alkyl amine is tert-butyl amine (TBA). TBA can be particularly useful for the reasons described.

In some embodiments, the SiN film produced has an undesirable carbon content. This in-film carbon may result in electrical leakage and may render the film unusable for some dielectric barrier applications. Carbon content can vary, but in some embodiments approximately 10% carbon (by weight) can be considered too high. Methods described herein address unwanted carbon in SiN films. Methods described herein produce SiN films with less than 2% carbon, in one embodiment less than 1% carbon, in yet another embodiment less than 0.5% carbon. In some embodiments, the reduction in carbon residue is readily observable in FTIR spectra, although other analytical methods are known to one of ordinary skill in the art that can measure carbon content in these ranges.

In some embodiments, the nitrogen-containing reactant can contain a thermally removable group. A thermally removable group is a group that breaks down into volatile components at between about 200° C. and about 550° C. For example, secondary and particularly tertiary carbon groups can undergo elimination reactions in this temperature range. In a particular example, t-butyl groups break down to form isobutylene in this temperature range. For example, t-butylamine, when heated, undergoes an elimination reaction to form isobutylene and ammonia. As another example, t-butoxycarbonyl groups (t-BOC) groups also thermally decompose, for example at about 150° C., to form isobutylene, carbon dioxide and the radical to which the t-BOC group was attached. For example, t-butylcarbamate thermally decomposes to give isobutylene ammonia and carbon dioxide.

The substrate can be heated to between about 200° C. and about 550° C. so that such groups decompose and release their carbon content and thus reduce the carbon content of the SiN film. The reactants are adsorbed onto the substrate, a plasma is used to convert the reactants to a SiN material. Remaining carbon groups can be removed by heating the substrate. The heating can be performed during the entire deposition or periodically to decompose the thermally removable groups. In one embodiment, the substrate is heated to between about 200° C. and about 550° C., in another embodiment between about 350° C. and about 550° C., in another embodiment between about 450° C. and about 550° C., and in another embodiment, between about 450° C. and about 500° C. In one embodiment, for example where TBA is used, the SiN film can be heated to between about 450° C. and about 500° C., for between about 1 second and about 30 seconds, or between about 1 second and about 20 seconds, or between about 1 second and about 10 seconds. Although any particular thermally removable group will breakdown at a certain temperature threshold, a higher temperature may be used to increase the rate of decomposition and/or as an anneal to improve the properties of the SiN film.

As described above, the thermally removable group may include a secondary or tertiary carbon functionality. Either or both of the silicon-containing reactant and the nitrogen-containing reactant can include one or more of the same or different thermally removable groups. In one embodiment, the thermally removable group is according to Formula II:

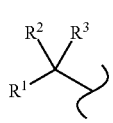

wherein each of $R^1$, $R^2$ and $R^3$ is, independent of the others, H or $C_{1-3}$ alkyl; or two of $R^1$, $R^2$ and $R^3$, together with the carbon atom to which they are attached form a $C_{3-7}$ cycloalkyl and the other of $R^1$, $R^2$ and $R^3$ is H or $C_{1-3}$ alkyl; and where each of said thermally removable group, when part of the nitrogen-containing reactant, is attached to a nitrogen or an oxygen of the nitrogen-containing reactant, and, when part of the silicon-containing reactant, is attached to a silicon or a nitrogen or an oxygen of the silicon-containing reactant. In one embodiment, each of $R^1$, $R^2$ and $R^3$ is, independent of the others, $C_{1-3}$ alkyl. In one embodiment, the thermally removable group is a t-butyl group.

Carbon-Free Nitrogen Containing Reactants

In some embodiments, the nitrogen-containing reactant is a carbon-free nitrogen-containing reactant. Examples include ammonia and hydrazine. For example, in some embodiments, TSA and ammonia are used as the silicon-containing reactant and nitrogen-containing reactant, respectively, for the deposition of SiN.

In some embodiments, for example, a carbon-free nitrogen-containing reactant is used to deposit the SiN film of a $SiO_2/SiN/SiO_2$ (also known as an ONO stack) for flash memory. The deposited film can be halogen- and carbon-free without even trace amounts of halogen or carbon present (unless from a contaminant source such as humans or an insufficiently clean after a previous process in the deposition tool).

Tuning Stress and Wet Etch Rate

In some embodiments, the nitrogen-containing reactant(s) can be chosen to tune the stress and/or wet etch rate of the deposited SiN film. For example, ammonia or other carbon-free nitrogen-containing reactant can be used to deposit tensile films having a high wet etch rate.

In another example, TBA or other carbon-containing nitrogen-containing reactant can be used to deposit etch resistant, compressive films.

In some embodiments, two nitrogen-containing reactants can be used to tune the stress of the desired film. For example, a carbon-containing nitrogen-containing reactant (e.g., TBA) and a carbon-free nitrogen-containing reactant (e.g., ammonia) can be used to deposit a SiN film having a desired stress and wet etch rate. In some embodiments, these nitrogen-containing reactants can be used with TSA to deposit a chlorine-free SiN film having a desired stress and wet etch rate.

In this manner, SiN films having stress ranging from −4 GPa (compressive) to 2 GPa (tensile) can be achieved. For example, in some embodiments, compressive SiN films having a stress between about −4 GPa and about −2 GPa can be achieved using a nitrogen-containing reactant flow of pure TBA (or other carbon-containing nitrogen-containing reactant). In some embodiments, tensile SiN having a stress between about 1 GPa and about 2 GPa can be achieved using a nitrogen-containing reactant flow of pure ammonia (or other carbon-free nitrogen-containing reactant). In some embodiments, a SiN film having a stress between about −2 GPa and 1 GPa can be achieved using a mixture of TBA (or other carbon-containing nitrogen-containing reactant) and ammonia (or other carbon-free nitrogen-containing reactant).

The stress values achievable using pure TBA (or other carbon-containing nitrogen-containing reactant), pure ammonia (or other carbon-free nitrogen-containing reactant) and mixtures of these can vary according to the particular embodiment and other process conditions including RF power and plasma duration during plasma phases of the processes described herein. Longer and higher power plasma can make a SiN film more compressive. In some embodiments, a SiN film deposited using TSA and only a carbon-free nitrogen-containing reactant(s) (e.g., ammonia and/or hydrazine) can be tuned to have a stress of anywhere from slightly compressive, e.g., −0.5 GPa, to a tensile stress of up to 2 GPa by appropriately modulating the RF power.

In some embodiments, for example, a tensile (1-2 GPa) SiN film can be deposited using TSA and a carbon-free nitrogen-containing reactant with a HFRF power of about 0.15 $W/cm^2$, with a slightly compressive SiN film deposited using TSA and a carbon-free nitrogen-containing reactant with a HFRF power close 1 $W/cm^2$. (RF powers are expressed in W/area of the substrate, e.g., a 300 mm wafer has an area of approximately 706 $cm^2$.) The films can be made more compressive by adding TBA or other carbon-containing nitrogen-containing reactant. In some cases, it can be difficult to form tensile films using TBA as a relatively high RF power is used to decompose the t-butyl group of the TBA molecule. Accordingly, it may be useful to use a carbon-free nitrogen containing reactant such as ammonia or hydrazine to achieve a tensile film. The RF plasmas are HF-only plasmas, though in some other embodiments, some LF power can be added.

The achievable ranges of wet etch using TSA and carbon-free reactant systems are also greater than conventional processes. For example wet etch rate ratio to thermal oxide (WERR) for SiN films deposited using TSA/ammonia can be about 2.0 for low HFRF power as described above. Increasing HFRF power to about 1 $W/cm^2$ or greater can lower the WERR to about 0.5. This compares to WERR for DCS/TBA systems, which can range from about 0.1 to 1.0.

Deposition at Low Temperature

As noted above, TSA can be used for low temperature reactions as it more reactive at the surface than, for example, dichlorosilane. In addition, in some embodiments, carbon-free nitrogen containing reactants allow deposition of high quality SiN films at lower temperatures than TBA or other nitrogen-containing reactants. For example, a DCS/TBA system begins to shows degraded sidewall deposition at 400° C. and below due to poor decomposition kinetics of the t-butyl group in the TBA molecule.

In some embodiments, SiN deposition using a halogen-free aminosilane and a carbon-free nitrogen-containing reactant can provide high quality SiN films at temperatures significantly lower than achievable with DCS/TBA and similar systems. For example, TSA/ammonia provide high quality deposition at 350° C., as well as at 400° C. or 450° C. Accordingly, in some embodiments, TSA can be used with one or more carbon-free nitrogen-containing reactants to at temperatures ranging from 50° C. to 450° C., or from 50° C. to 400° C., or from 50° C. to 350° C.

Conformal Films

According to various embodiments, the processes described herein can deposit SiN films that are highly conformal to the substrate surface on which they are deposited. In some embodiments, step coverage is at least 90%. For the purposes of this description, "step coverage" is defined as a ratio of two thicknesses of the deposited film, with bottom step coverage being the ratio: thickness at the bottom of the feature/thickness at the top of the feature, and side step coverage being the ratio: thickness on a sidewall of the feature/thickness at the top of the feature.

Apparatus

Another aspect of the invention is an apparatus configured to accomplish the methods described herein. A suitable apparatus includes hardware for accomplishing the process operations and a system controller having instructions for controlling process operations in accordance with the present invention.

Figure 5:
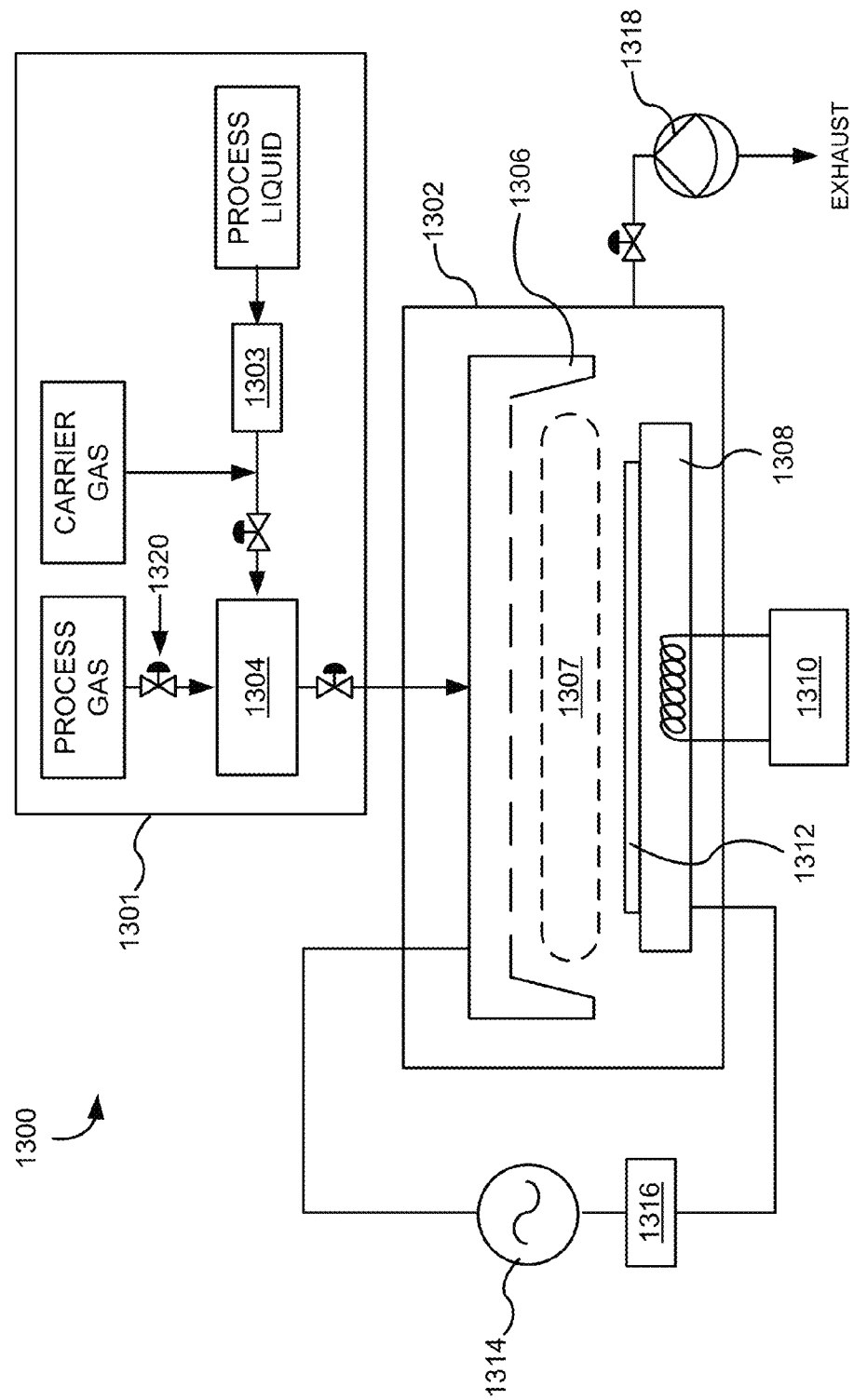
FIG. 5 depicts an example of a CFD processing station.
Figure 6:
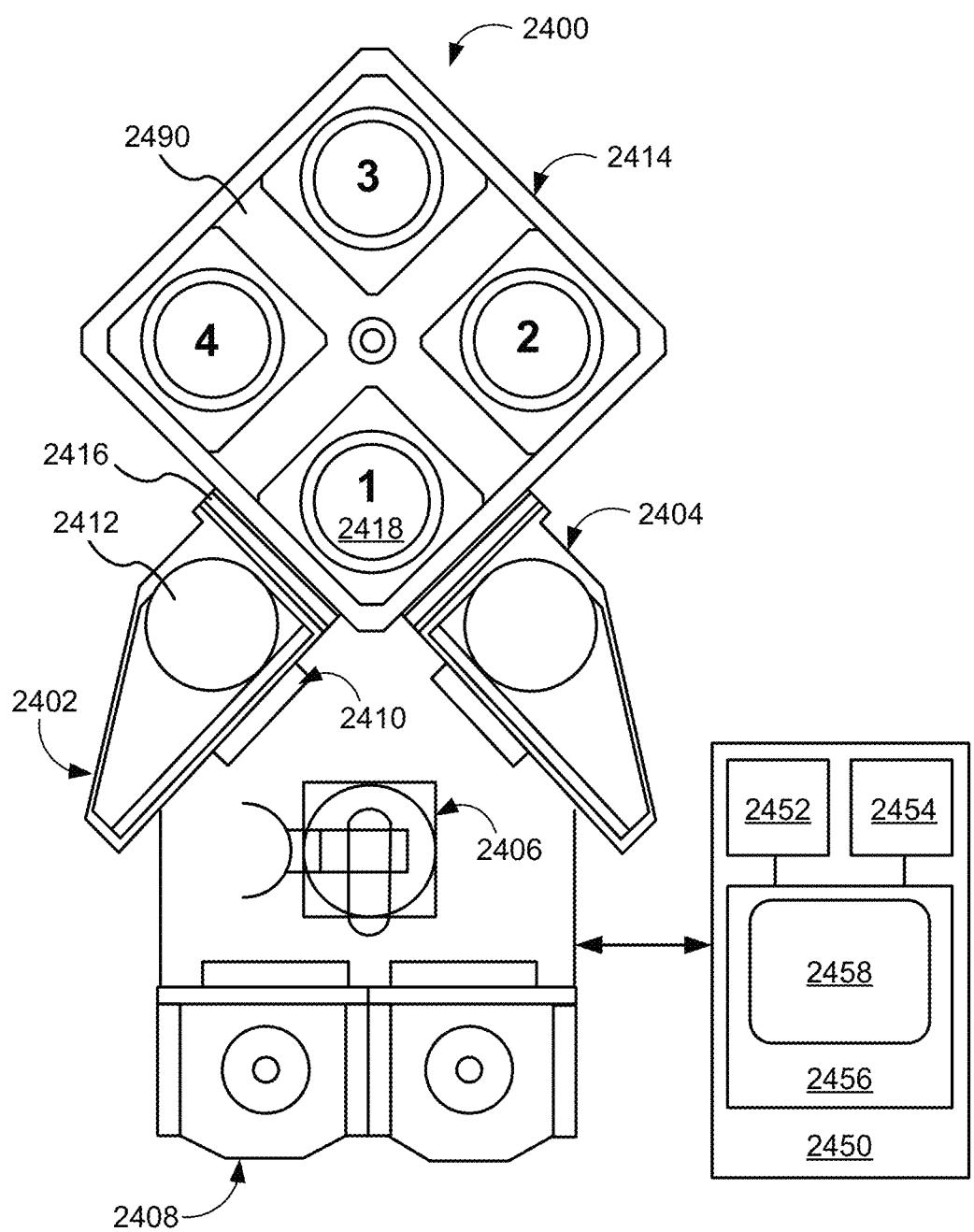
FIG. 6 depicts an example of a schematic view of a multi-station processing tool.

It will be appreciated that any suitable process station may be employed with one or more of the embodiments described above. For example, FIG. 5 schematically shows a CFD process station 1300. For simplicity, CFD process station 1300 is depicted as a standalone process station having a process chamber body 1302 for maintaining a low-pressure environment. However, it will be appreciated that a plurality of CFD process stations 1300 may be included in a common low-pressure process tool environment. While the embodiment depicted in FIG. 5 shows one process station, it will be appreciated that, in some embodiments, a plurality of process stations may be included in a processing tool. For example, FIG. 6 depicts an embodiment of a multi-station processing tool 2400. Further, it will be appreciated that, in some embodiments, one or more hardware parameters of CFD process station 1300, including those discussed in detail below, may be adjusted programmatically by one or more computer controllers.

A CFD process station 1300 fluidly communicates with reactant delivery system 1301 for delivering process gases to a distribution showerhead 1306. Reactant delivery system 1301 includes a mixing vessel 1304 for blending and/or conditioning process gases for delivery to showerhead 1306. One or more mixing vessel inlet valves 1320 may control introduction of process gases to mixing vessel 1304.

Some reactants may be stored in liquid form prior to vaporization at and subsequent delivery to the process station. For example, the apparatus of FIG. 5 includes a vaporization point 1303 for vaporizing liquid reactant to be supplied to mixing vessel 1304. In some embodiments, vaporization point 1303 may be a heated vaporizer. The saturated reactant vapor produced from such vaporizers may condense in downstream delivery piping. Exposure of incompatible gases to the condensed reactant may create small particles. These small particles may clog piping, impede valve operation, contaminate substrates, etc. Some approaches to addressing these issues involve sweeping and/or evacuating the delivery piping to remove residual reactant. However, sweeping the delivery piping may increase process station cycle time, degrading process station throughput. Thus, in some embodiments, delivery piping downstream of vaporization point 1303 is heat traced. In some examples, mixing vessel 1304 is also heat traced. In one non-limiting example, piping downstream of vaporization point 1303 has an increasing temperature profile extending from approximately 100° C. to approximately 150° C. at mixing vessel 1304.

In some embodiments, reactant liquid is vaporized at a liquid injector. For example, a liquid injector may inject pulses of a liquid reactant into a carrier gas stream upstream of the mixing vessel. In one embodiment, a liquid injector vaporizes reactant by flashing the liquid from a higher pressure to a lower pressure. In another embodiment, a liquid injector atomizes the liquid into dispersed microdroplets that are subsequently vaporized in a heated delivery pipe. It will be appreciated that smaller droplets may vaporize faster than larger droplets, reducing a delay between liquid injection and complete vaporization. Faster vaporization may reduce a length of piping downstream from vaporization point 1303. In one embodiment, a liquid injector is mounted directly to mixing vessel 1304. In another embodiment, a liquid injector is mounted directly to showerhead 1306.

In some embodiments, a liquid flow controller upstream of vaporization point 1303 is provided for controlling a mass flow of liquid for vaporization and delivery to process station 1300. In one example, the liquid flow controller (LFC) includes a thermal mass flow meter (MFM) located downstream of the LFC. A plunger valve of the LFC is adjusted responsive to feedback control signals provided by a proportional-integral-derivative (PID) controller in electrical communication with the MFM. However, it may take one second or more to stabilize liquid flow using feedback control. This may extend a time for dosing a liquid reactant. Thus, in some embodiments, the LFC is dynamically switched between a feedback control mode and a direct control mode. In some embodiments, the LFC is dynamically switched from a feedback control mode to a direct control mode by disabling a sense tube of the LFC and the PID controller.

Showerhead 1306 distributes process gases toward substrate 1312. In the embodiment shown in FIG. 5, substrate 1312 is located beneath showerhead 1306, and is shown resting on a pedestal 1308. It will be appreciated that showerhead 1306 may have any suitable shape, and may have any suitable number and arrangement of ports for distributing processes gases to substrate 1312.

In some embodiments, a microvolume 1307 is located beneath showerhead 1306. Performing a CFD process in a microvolume rather than in the entire volume of a process station may reduce reactant exposure and sweep times, may reduce times for altering CFD process conditions (e.g., pressure, temperature, etc.), may limit an exposure of process station robotics to process gases, etc. Example microvolume sizes include, but are not limited to, volumes between 0.1 liter and 2 liters.

In some embodiments, pedestal 1308 may be raised or lowered to expose substrate 1312 to microvolume 1307 and/or to vary a volume of microvolume 1307. For example, in a substrate transfer phase, pedestal 1308 is lowered to allow substrate 1312 to be loaded onto pedestal 1308. During a CFD process phase, pedestal 1308 is raised to position substrate 1312 within microvolume 1307. In some embodiments, microvolume 1307 completely encloses substrate 1312 as well as a portion of pedestal 1308 to create a region of high flow impedance during a CFD process.

Optionally, pedestal 1308 may be lowered and/or raised during portions the CFD process to modulate process pressure, reactant concentration, etc., within microvolume 1307. In one embodiment where process chamber body 1302 remains at a base pressure during the CFD process, lowering pedestal 1308 allows microvolume 1307 to be evacuated. Example ratios of microvolume to process chamber volume include, but are not limited to, volume ratios between 1:500 and 1:10. It will be appreciated that, in some embodiments, pedestal height may be adjusted programmatically by a suitable computer controller.

In another embodiment, adjusting a height of pedestal 1308 allows a plasma density to be varied during plasma activation and/or treatment cycles included in the CFD process. At the conclusion of the CFD process phase, pedestal 1308 is lowered during another substrate transfer phase to allow removal of substrate 1312 from pedestal 1308.

While the example microvolume variations described herein refer to a height-adjustable pedestal, it will be appreciated that, in some embodiments, a position of showerhead 1306 may be adjusted relative to pedestal 1308 to vary a volume of microvolume 1307. Further, it will be appreciated that a vertical position of pedestal 1308 and/or showerhead 1306 may be varied by any suitable mechanism. One of ordinary skill in the art would appreciate that such mechanism would include, for example, hydraulics, pneumatics, spring mechanisms, solenoids and the like. In some embodiments, pedestal 1308 may include a rotational mechanism, for example along an axis perpendicular to the surface of the substrate, for rotating an orientation of substrate 1312. It will be appreciated that, in some embodiments, one or more of these example adjustments may be performed programmatically by one or more suitable computer controllers.

Returning to the embodiment shown in FIG. 5, showerhead 1306 and pedestal 1308 electrically communicate with RF power supply 1314 and matching network 1316 for powering a plasma. In some embodiments, the plasma energy is controlled by controlling one or more of a process station pressure, a gas concentration, an RF source power, an RF source frequency, and a plasma power pulse timing. For example, RF power supply 1314 and matching network 1316 may be operated at any suitable power to form a plasma having a desired composition of radical species. Examples of suitable powers include, but are not limited to, powers between 100 W and 5000 W. Likewise, RF power supply 1314 may provide RF power of any suitable frequency. In some embodiments, RF power supply 1314 may be configured to control high- and low-frequency RF power sources independently of one another. Example low-frequency RF frequencies may include, but are not limited to, frequencies between 50 kHz and 500 kHz. Example high-frequency RF frequencies may include, but are not limited to, frequencies between 1.8 MHz and 2.45 GHz. It will be appreciated that any suitable parameters may be modulated discretely or continuously to provide plasma energy for the surface reactions. In one non-limiting example, the plasma power may be intermittently pulsed to reduce ion bombardment with the substrate surface relative to continuously powered plasmas.

In some embodiments, the plasma is monitored in-situ by one or more plasma monitors. In one embodiment, plasma power is monitored by one or more voltage, current sensors (e.g., VI probes). In another embodiment, plasma density and/or process gas concentration is measured by one or more optical emission spectroscopy sensors (OES). In some embodiments, one or more plasma parameters are programmatically adjusted based on measurements from such in-situ plasma monitors. For example, an OES sensor may be used in a feedback loop for providing programmatic control of plasma power. It will be appreciated that, in some embodiments, other monitors may be used to monitor the plasma and other process characteristics. Such monitors include, but are not limited to, infrared (IR) monitors, acoustic monitors, and pressure transducers.

In some embodiments, the plasma is controlled via input/output control (IOC) sequencing instructions. For example, the instructions for setting plasma conditions for a plasma process phase may be included in a corresponding plasma activation recipe phase of a CFD process recipe. In some embodiments, process recipe phases may be sequentially arranged, so that all instructions for a CFD process phase are executed concurrently with that process phase. It will be appreciated that some aspects of plasma generation may have well-characterized transient and/or stabilization times that may prolong a plasma process phase. Put another way, such time delays may be predictable. Such time delays may include a time to strike the plasma and a time to stabilize the plasma at the indicted power setting.

In some embodiments, pedestal 1308 may be temperature controlled via heater 1310. Further, in some embodiments, pressure control for CFD process station 1300 may be provided by butterfly valve 1318. As shown in FIG. 5, butterfly valve 1318 throttles a vacuum provided by a downstream vacuum pump (not shown). However, in some embodiments, pressure control of process station 1300 may also be adjusted by varying a flow rate of one or more gases introduced to CFD process station 1300.

As described above, one or more process stations may be included in a multi-station processing tool. FIG. 6 shows a schematic view of a multi-station processing tool, 2400, with an inbound load lock 2402 and an outbound load lock 2404, either or both of which may comprise a remote plasma source. A robot 2406, at atmospheric pressure, is configured to move wafers from a cassette loaded through a pod 2408 into inbound load lock 2402 via an atmospheric port 2410. A wafer is placed by the robot 2406 on a pedestal 2412 in the inbound load lock 2402, the atmospheric port 2410 is closed, and the load lock is pumped down. Where the inbound load lock 2402 comprises a remote plasma source, the wafer may be exposed to a remote plasma treatment in the load lock prior to being introduced into a processing chamber 2414. Further, the wafer also may be heated in the inbound load lock 2402 as well, for example, to remove moisture and adsorbed gases. Next, a chamber transport port 2416 to processing chamber 2414 is opened, and another robot (not shown) places the wafer into the reactor on a pedestal of a first station shown in the reactor for processing. While the embodiment depicted in FIG. 6 includes load locks, it will be appreciated that, in some embodiments, direct entry of a wafer into a process station may be provided.

The depicted processing chamber 2414 comprises four process stations, numbered from 1 to 4 in the embodiment shown in FIG. 6. Each station has a heated pedestal (shown at 2418 for station 1), and gas line inlets. It will be appreciated that in some embodiments, each process station may have different or multiple purposes. For example, in some embodiments, a process station may be switchable between a CFD and PECVD process mode. Additionally or alternatively, in some embodiments, processing chamber 2414 may include one or more matched pairs of CFD and PECVD process stations. While the depicted processing chamber 2414 comprises four stations, it will be understood that a processing chamber according to the present disclosure may have any suitable number of stations. For example, in some embodiments, a processing chamber may have five or more stations, while in other embodiments a processing chamber may have three or fewer stations.

FIG. 6 also depicts a wafer handling system 2490 for transferring wafers within processing chamber 2414. In some embodiments, wafer handling system 2490 may transfer wafers between various process stations and/or between a process station and a load lock. It will be appreciated that any suitable wafer handling system may be employed. Non-limiting examples include wafer carousels and wafer handling robots. FIG. 6 also depicts a system controller 2450 employed to control process conditions and hardware states of process tool 2400. System controller 2450 may include one or more memory devices 2456, one or more mass storage devices 2454, and one or more processors 2452. Processor 2452 may include a CPU or computer, analog and/or digital input/output connections, stepper motor controller boards, etc.

In some embodiments, system controller 2450 controls all of the activities of process tool 2400. System controller 2450 executes system control software 2458 stored in mass storage device 2454, loaded into memory device 2456, and executed on processor 2452. System control software 2458 may include instructions for controlling the timing, mixture of gases, chamber and/or station pressure, chamber and/or station temperature, wafer temperature, target power levels, RF power levels, substrate pedestal, chuck and/or susceptor position, and other parameters of a particular process performed by process tool 2400. System control software 2458 may be configured in any suitable way. For example, various process tool component subroutines or control objects may be written to control operation of the process tool components necessary to carry out various process tool processes. System control software 2458 may be coded in any suitable computer readable programming language.

In some embodiments, system control software 2458 may include input/output control (IOC) sequencing instructions for controlling the various parameters described above. For example, each phase of a CFD process may include one or more instructions for execution by system controller 2450. The instructions for setting process conditions for a CFD process phase may be included in a corresponding CFD recipe phase. In some embodiments, the CFD recipe phases may be sequentially arranged, so that all instructions for a CFD process phase are executed concurrently with that process phase.

Other computer software and/or programs stored on mass storage device 2454 and/or memory device 2456 associated with system controller 2450 may be employed in some embodiments. Examples of programs or sections of programs for this purpose include a substrate positioning program, a process gas control program, a pressure control program, a heater control program, and a plasma control program.

A substrate positioning program may include program code for process tool components that are used to load the substrate onto pedestal 2418 and to control the spacing between the substrate and other parts of process tool 2400.

A process gas control program may include code for controlling gas composition and flow rates and optionally for flowing gas into one or more process stations prior to deposition in order to stabilize the pressure in the process station. A pressure control program may include code for controlling the pressure in the process station by regulating, for example, a throttle valve in the exhaust system of the process station, a gas flow into the process station, etc.

A heater control program may include code for controlling the current to a heating unit that is used to heat the substrate. Alternatively, the heater control program may control delivery of a heat transfer gas (such as helium) to the substrate.

A plasma control program may include code for setting RF power levels applied to the process electrodes in one or more process stations.

In some embodiments, there may be a user interface associated with system controller 2450. The user interface may include a display screen, graphical software displays of the apparatus and/or process conditions, and user input devices such as pointing devices, keyboards, touch screens, microphones, etc.

In some embodiments, parameters adjusted by system controller 2450 may relate to process conditions. Non-limiting examples include process gas composition and flow rates, temperature, pressure, plasma conditions (such as RF bias power levels), pressure, temperature, etc. These parameters may be provided to the user in the form of a recipe, which may be entered utilizing the user interface.

Signals for monitoring the process may be provided by analog and/or digital input connections of system controller 2450 from various process tool sensors. The signals for controlling the process may be output on the analog and digital output connections of process tool 2400. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

System controller 2450 may provide program instructions for implementing the above-described deposition processes. The program instructions may control a variety of process parameters, such as DC power level, RF bias power level, pressure, temperature, etc. The instructions may control the parameters to operate in-situ deposition of film stacks according to various embodiments described herein.

The system controller will typically include one or more memory devices and one or more processors configured to execute the instructions so that the apparatus will perform a method in accordance with the present invention. Machine-readable media containing instructions for controlling process operations in accordance with the present invention may be coupled to the system controller.

Patterning Method/Apparatus:

The apparatus/process described herein may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically comprises some or all of the following steps, each step enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper. In one embodiment, a SiN film is formed using a method as described herein. The SiN film is used, for example, for one of the purposes described herein. Further, the method includes one or more steps (1)-(6) described above.

EXAMPLES

The invention is further understood by reference to the following examples, which are intended to be purely exemplary. The present invention is not limited in scope by the exemplified embodiments, which are intended as illustrations of single aspects of the invention only. Any methods that are functionally equivalent are within the scope of the invention. Various modifications of the invention in addition to those described herein will become apparent to those skilled in the art from the foregoing description and accompanying figures. Moreover, such modifications fall within the scope of the appended claims.

Example 1

Table 1 includes a number of reaction partners, and temperature and pressure parameters that may be used to make SiN films in accordance with the embodiments described herein.

| Process ID | Silicon- Containing Reactant | Nitrogen- Containing Reactant(s) (% are vol. %) | Temp(° C.) | RF Power Density (W/cm$^2$) |
|---|---|---|---|---|
| A | TSA | NH$_3$ | 50-550 | 0.15-3 |
| B | TSA | NH$_3$ | 50-450 | 0.15-0.5 |
| C | TSA | NH$_3$ | 300-400 | 0.15-0.5 |
| D | TSA | NH$_3$ | 300-400 | 1-3 |
| E | TSA | 75% NH$_3$/ 25% TBA | 50-550 | 0.15-3 |
| G | TSA | 50% NH3/ 50% TBA | 50-550 | 1-3 |
| H | TSA | 25% NH3/ 75% TBA | 50-550 | 1-3 |
| I | TSA | TBA | 400-550 | 1-3 |

Process A uses TSA as a silicon-containing reactant with ammonia as the nitrogen-containing reactant. Temperatures can range from 50° C. to about 550° C. according to the requirements of the substrate being processed. RF power can range from about 0.15 W/cm$^2$ to about 3 W/cm$^2$ to tune the stress as described above.

Process B is a specific example of process A, using TSA and ammonia at a lower temperature of between about 50° C. and 450° C., depending on thermal budget concerns, to deposit a tensile SiN film. Substrates having copper films for example, may be processed at less than about 400° C. to prevent alteration of the grain structure of the copper. GST alloys, for example, may be processed at temperatures around 350° C.-375° C. As described above, TSA and ammonia can be used to provide high quality films having high step coverage at these lower temperatures at reasonable deposition rates. RF power is relatively low to achieve a tensile film.

Process C is another specific example of process A, using TSA and ammonia at a lower temperature of between about 300° C. and 400° C., depending on thermal budget concerns, to deposit a tensile SiN film. Temperatures in this range may be useful to deposit SiN films on substrates including copper, GST alloys, and other thermally sensitive materials, while maintaining a higher deposition rate.

Process D is another specific example of process A, and is similar to process C except using a higher RF power to deposit a more compressive film.

Processes E-H are examples of processes that use mixtures of ammonia and TBA as nitrogen-containing reactants to tune the stress and wet etch rate of the deposited SiN film. In one example, Process E could be used with a high RF level such as that of Process D, with the presence of TBA making the film even more compressive.

Process I is an example of a process using TSA and TBA as silicon-containing and nitrogen-containing reactants, respectively. Process I may be used, for example, to deposit a compressive halogen-free SiN film.

In the above process examples, carbon-free nitrogen-containing reactants such as hydrazine may be used instead of or in addition to ammonia. Other carbon-containing reactants as described above may be used instead of or in addition to TBA.

Example 2

A 300 mm wafer is placed into vacuum chamber. The wafer is supported within the chamber on an aluminum pedestal which is heated throughout the procedure. For example, the pedestal is heated at a constant temperature that is between about 50° C. and about 550° C. Trisilylamine (TSA) is introduced into the reactor as a vapor phase flow at between about 0.25 slm and about 5 slm (standard liters per minute) for between about 1 second and about 30 seconds to adsorb TSA onto the surface of the wafer. After the TSA flow is ceased, the inert gas flow in the reactor purges the remaining vapor phase TSA and any byproducts. Then, an ammonia vapor phase flow is established in the reactor at between about 1 slm and about 10 slm for between about 1 second and about 30 seconds. A plasma, for example 13.56 MHz at 150 W power, is ignited above the wafer for between about 1 second and about 15 seconds. The inert gas flow in the reactor purges the remaining vapor phase ammonia and any byproducts. The TSA flow, inert gas purge, ammonia flow, plasma and inert gas purge are repeated to deposit a SiN film of desired thickness. Each cycle as described deposits between about 0.5 Å and about 1.5 Å of a SiN film.

Alternatively, 1-5 slm of TBA can be used in addition to or instead of the ammonia.

In another alternative, in a CFD run, the ammonia flow (and/or TBA flow) is run continuously. In these runs, the same conditions as described above are used, except the ammonia flow is established first and maintained. The TSA flow is introduced into the reactor at the same rate and time as described above, followed by an inert gas purge as described above. The plasma is ignited as described above, followed by an inert gas purge as described above. The TSA flow, inert gas purge, plasma ignition and inert gas purge are repeated to deposit a SiN film of desired thickness. Each cycle as described deposits between about 0.5 Å and about 1.5 Å of a SiN film.

Example 3

Figure 7:
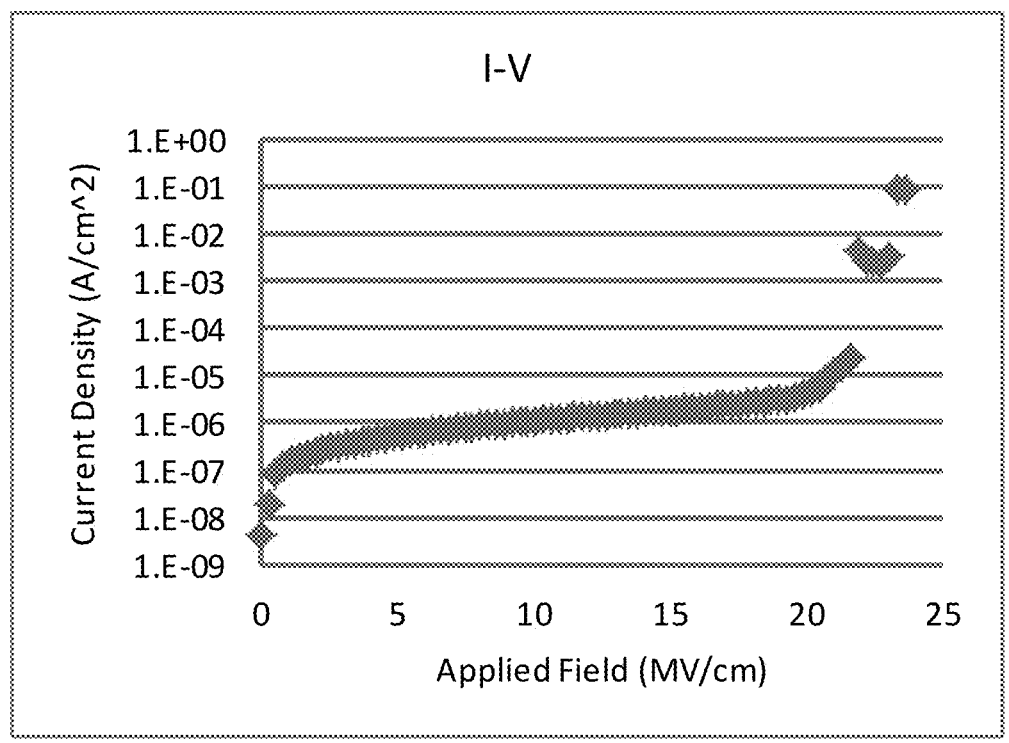
FIG. 7 shows an I-V curve for a SiN film deposited using TSA/ammonia system.
Figure 8:
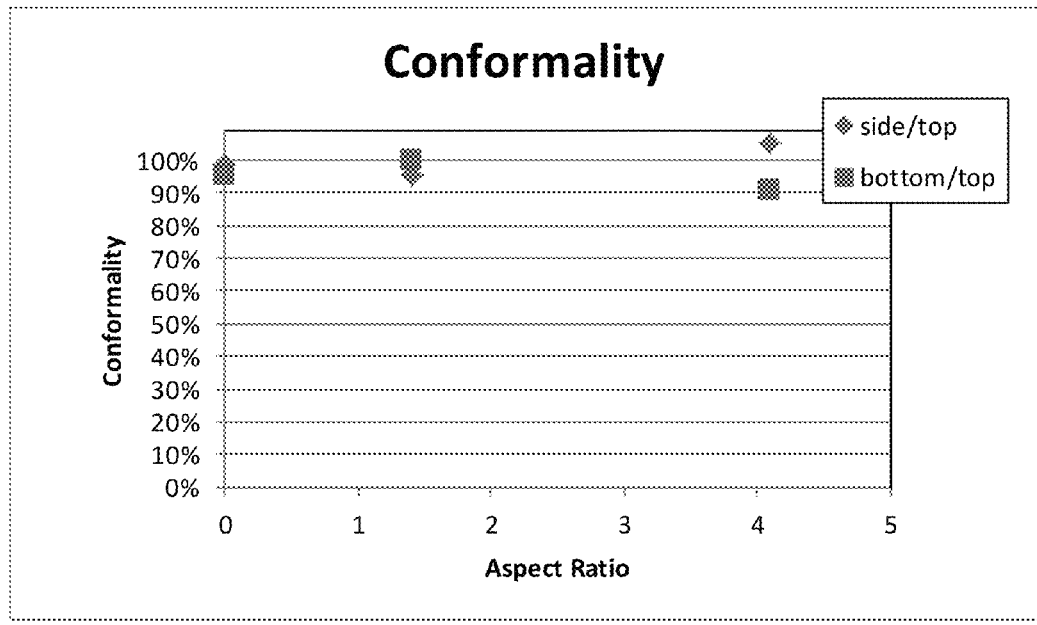
FIG. 8 shows bottom and side step coverage of SiN films deposited using TSA/ammonia systems for various feature aspect ratios.

A process as described in Example 2 was used to deposit SiN films using TSA and ammonia at 450° C. FIG. 7 shows an I-V curve for a deposited film. Notably, the SiN film does not break down for applied fields of up about 22 MV/cm. FIG. 8 shows bottom and side step coverage for various feature aspect ratios.

Processes were used to deposit SiN films with the following systems: DCS/TBA, TSA/TBA and TSA/ammonia. The refractive index for each film was DCS/TBA: 1.83, TSA/TBA: 1.83 and TSA/ammonia: 1.90.

Although the foregoing has been described in some detail for purposes of clarity of understanding, it will be apparent that certain changes and modifications may be practiced within the scope of the appended claims. It should be noted that there are many alternative ways of implementing the processes, systems and apparatus described. Accordingly, the described embodiments are to be considered as illustrative and not restrictive.

What is claimed is:

1. A method of forming a silicon nitride material on a substrate in a reaction chamber, comprising:

periodically exposing the substrate to a vapor phase flow of a halogen-free silicon-containing reactant wherein the silicon containing reactant is adsorbed onto the surface of the substrate;

exposing the substrate to a vapor phase flow of a first nitrogen-containing reactant wherein the nitrogen-containing reactant is adsorbed onto the surface of the substrate; and periodically igniting a plasma in the reaction chamber when vapor phase nitrogen-containing reactant is present in the reaction chamber and the vapor phase flow of the silicon-containing reactant has ceased, wherein the plasma is an RF plasma having a power between 0.15 W/cm$^2$ and 3 W/cm$^2$;

wherein the pressure in the reaction chamber is cycled such that it is higher during the vapor phase flow of the silicon-containing reactant than when the vapor phase flow of the silicon-containing reactant has ceased.

2. The method of claim 1, wherein the plasma has a power between 0.15 W/cm$^2$ and 1 W/cm$^2$.

3. The method of claim 1, wherein the silicon containing reactant is trisilylamine (TSA).

4. The method of claim 1, wherein the first nitrogen-containing reactant is ammonia, hydrazine, or hydroxylamine.

5. The method of claim 1, wherein the substrate includes a germanium-tellurium-antimony alloy.

6. The method of claim 1, wherein the substrate includes a metal surface on which the silicon nitride material is formed.

7. The method of claim 1, wherein the substrate includes an oxide surface on which the silicon nitride material is formed.

8. The method of claim 1, wherein the pressure in the reaction chamber is cycled between a first pressure and a second pressure, the first pressure being between about 5 and 50 Torr and the second pressure between about 1 and 5 Torr.

9. The method of claim 1, wherein the substrate is continuously exposed to the vapor phase flow of the first nitrogen-containing reactant throughout the method.

10. The method of claim 1, wherein the substrate is periodically exposed to the vapor phase flow of the first nitrogen-containing reactant.

11. The method of claim 1, wherein the plasma is a HF-only RF plasma.

12. The method of claim 1, further comprising:
exposing the substrate to a vapor phase flow of a second nitrogen-containing reactant that is different from the first nitrogen-containing reactant, wherein the first nitrogen-containing reactant is carbon-free and the second nitrogen-containing reactant contains carbon.

13. The method of claim 1, wherein the first nitrogen-containing reactant is carbon-free.

14. The method of claim 1, wherein the first nitrogen-containing reactant is an amine.

15. The method of claim 1, wherein the substrate temperature is maintained at no more than about 400° C.

16. The method of claim 15, wherein the substrate temperature is maintained at no more than about 350° C.

17. The method of claim 1, wherein the stress of the silicon nitride material is between about −4 GPa and −2 GPa.

18. The method of claim 1, wherein the stress of the silicon nitride material is between about −2 GPa and 1 GPa.

19. The method of claim 1, wherein the substrate surface includes one or more raised or recessed features and the silicon nitride material is conformal to the one or more raised or recessed features.

* * * * *